US010255960B2

(12) United States Patent
Shimizu

(10) Patent No.: US 10,255,960 B2
(45) Date of Patent: Apr. 9, 2019

(54) WRITE PULSE GENERATOR IN A RESISTIVE MEMORY

(71) Applicant: TOSHIBA MEMORY CORPORATION, Minato-ku, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/455,969

(22) Filed: Mar. 10, 2017

(65) Prior Publication Data

US 2018/0075894 A1 Mar. 15, 2018

Related U.S. Application Data

(60) Provisional application No. 62/394,183, filed on Sep. 13, 2016.

(51) Int. Cl.
*G11C 11/16* (2006.01)
*G11C 13/00* (2006.01)

(52) U.S. Cl.
CPC ...... *G11C 11/1675* (2013.01); *G11C 11/1693* (2013.01); *G11C 13/0061* (2013.01); *G11C 13/0069* (2013.01); *G11C 2013/0092* (2013.01)

(58) Field of Classification Search
None
See application file for complete search history.

(56) References Cited

U.S. PATENT DOCUMENTS

| 8,248,131 | B2 | 8/2012 | Kurokawa |
| 2002/0089024 | A1* | 7/2002 | Iwata ..................... B82Y 10/00 257/421 |
| 2004/0252551 | A1 | 12/2004 | Iwata et al. |
| 2009/0141549 | A1* | 6/2009 | Lee ........................ G11C 7/1078 365/163 |
| 2010/0131708 | A1* | 5/2010 | Park .................... G11C 13/0069 711/115 |
| 2012/0106242 | A1 | 5/2012 | Lee et al. |
| 2013/0169347 | A1* | 7/2013 | Kim ....................... G06F 1/206 327/513 |
| 2016/0049195 | A1* | 2/2016 | Yu ...................... G11C 13/0026 365/63 |

FOREIGN PATENT DOCUMENTS

JP 2009055597 A 3/2009

* cited by examiner

*Primary Examiner* — J. H. Hur
(74) *Attorney, Agent, or Firm* — Holtz, Holtz & Volek PC

(57) ABSTRACT

According to one embodiment, a semiconductor memory device comprises a memory cell including a variable resistance element; and a first circuit configured to control writing to the memory cell. The first circuit is configured to generate a first pulse of a second signal based on a first signal from outside, generate a second pulse of a third signal obtained by delaying the first pulse, and generate a third pulse of a fourth signal obtained by delaying the second pulse. A falling edge of the first pulse is based on a rising edge of the second pulse. A write pulse is output based on the fourth signal.

17 Claims, 17 Drawing Sheets

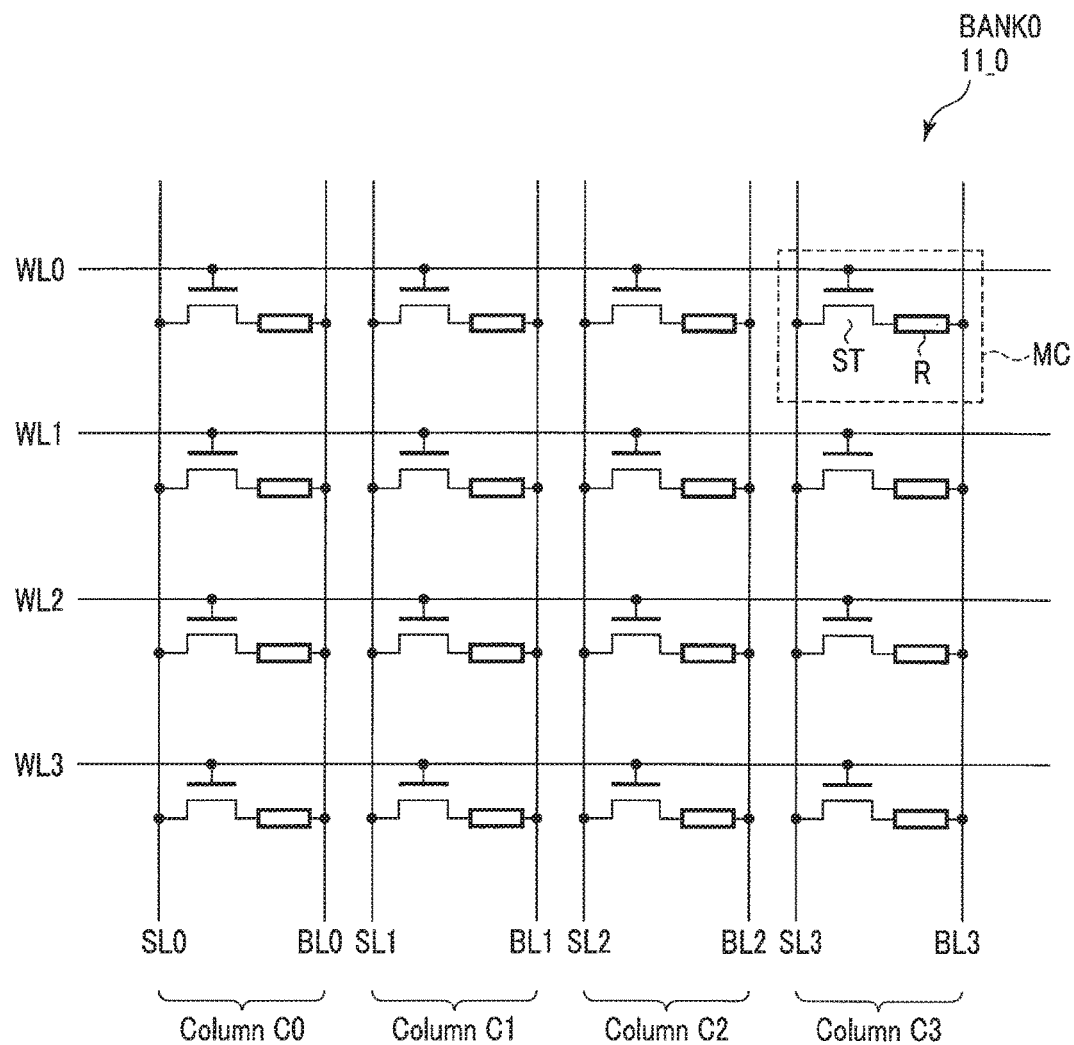
F I G. 2

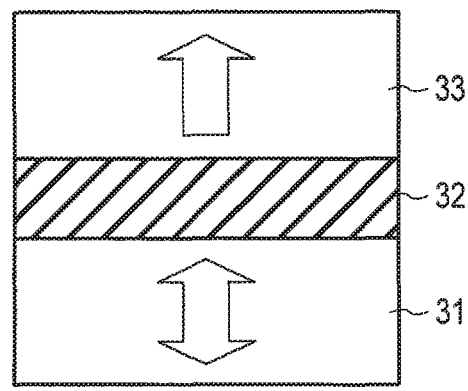
F I G. 3A
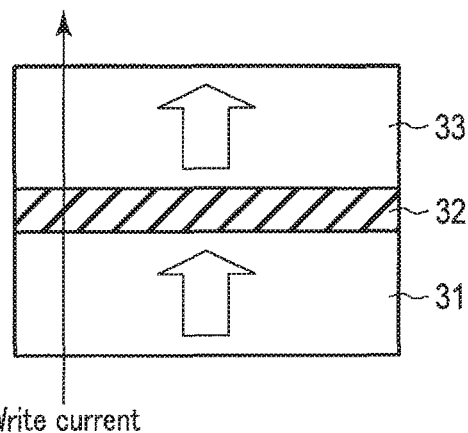
F I G. 3B  Parallel state (low resistance)
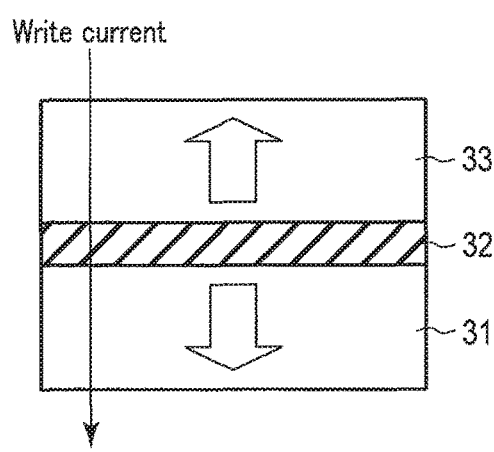
F I G. 3C  Anti-parallel state (high resistance)

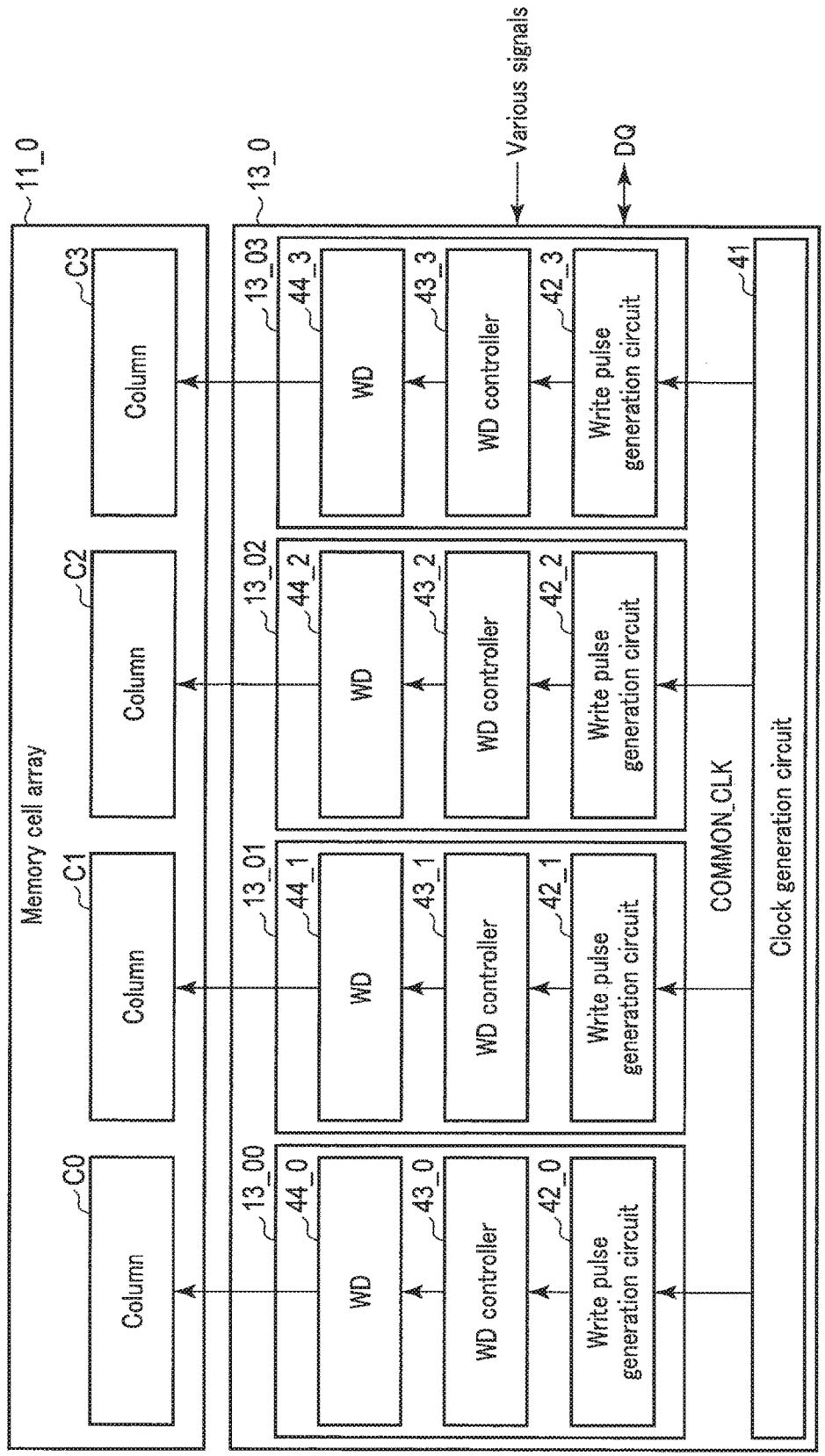
F I G. 4

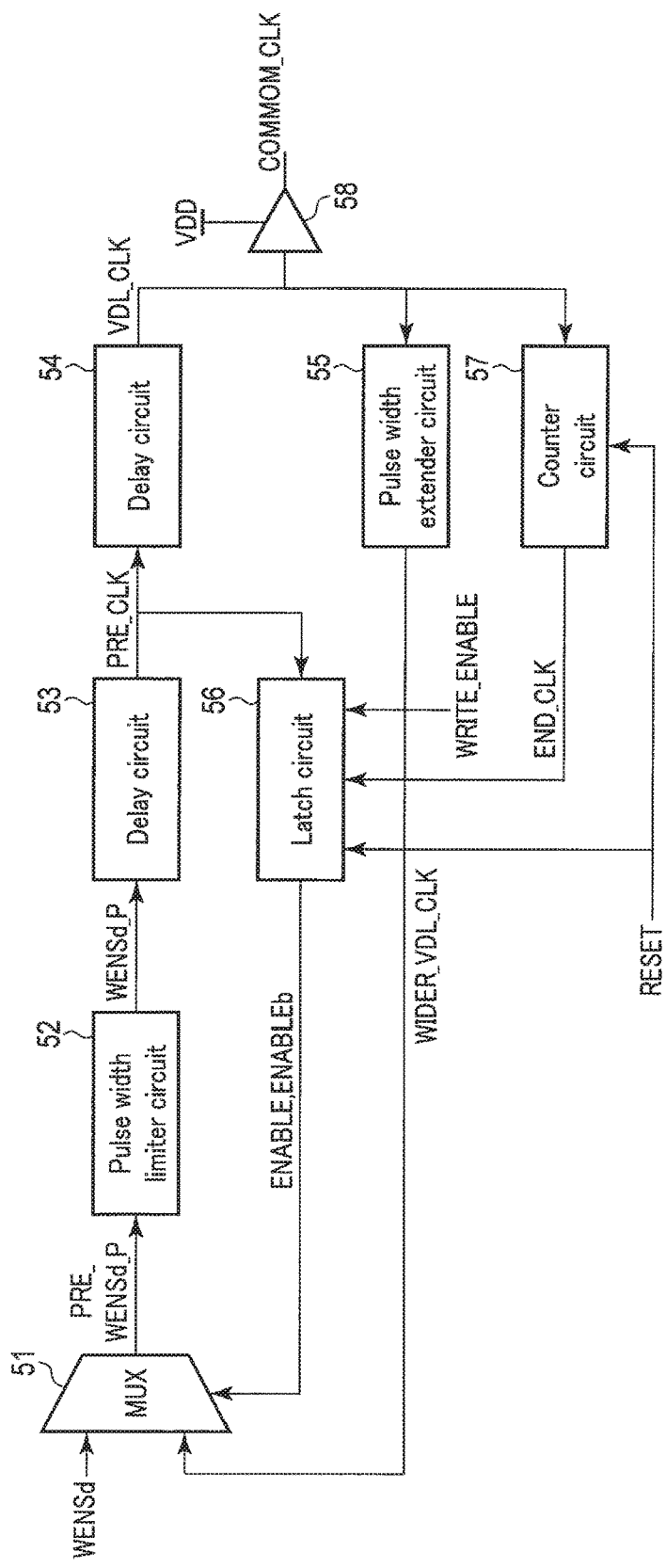
F I G. 5

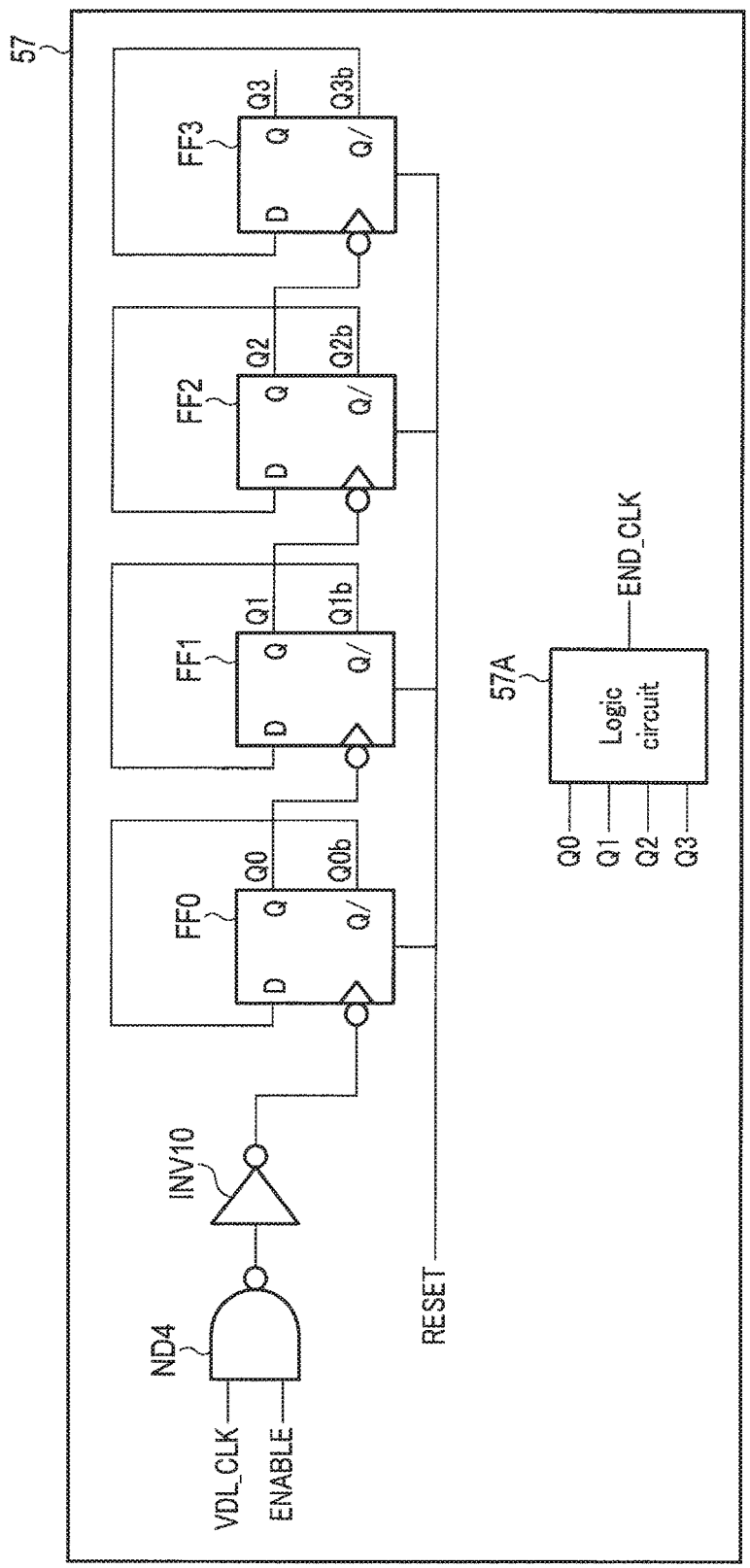
F I G. 10

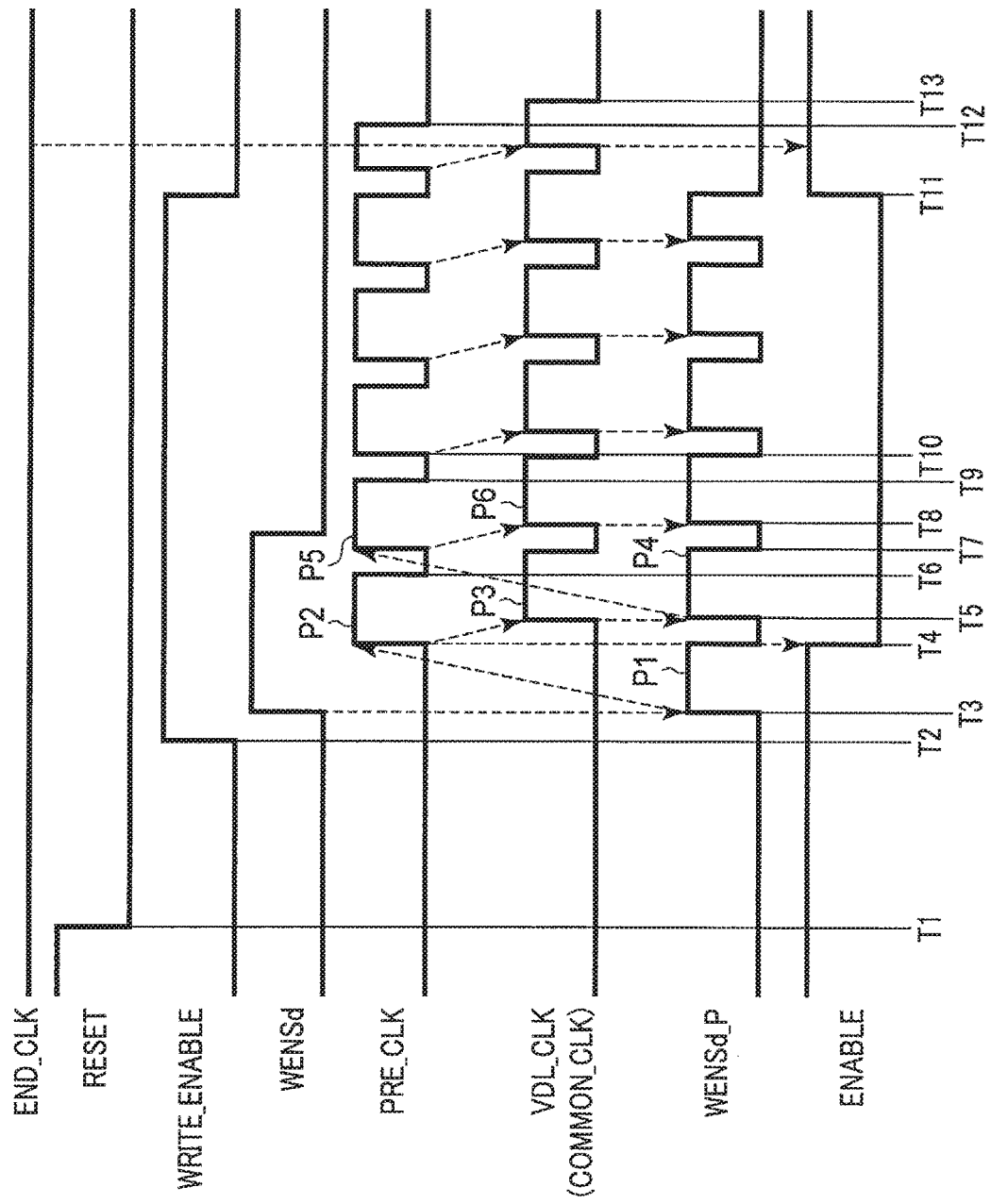
F I G. 11

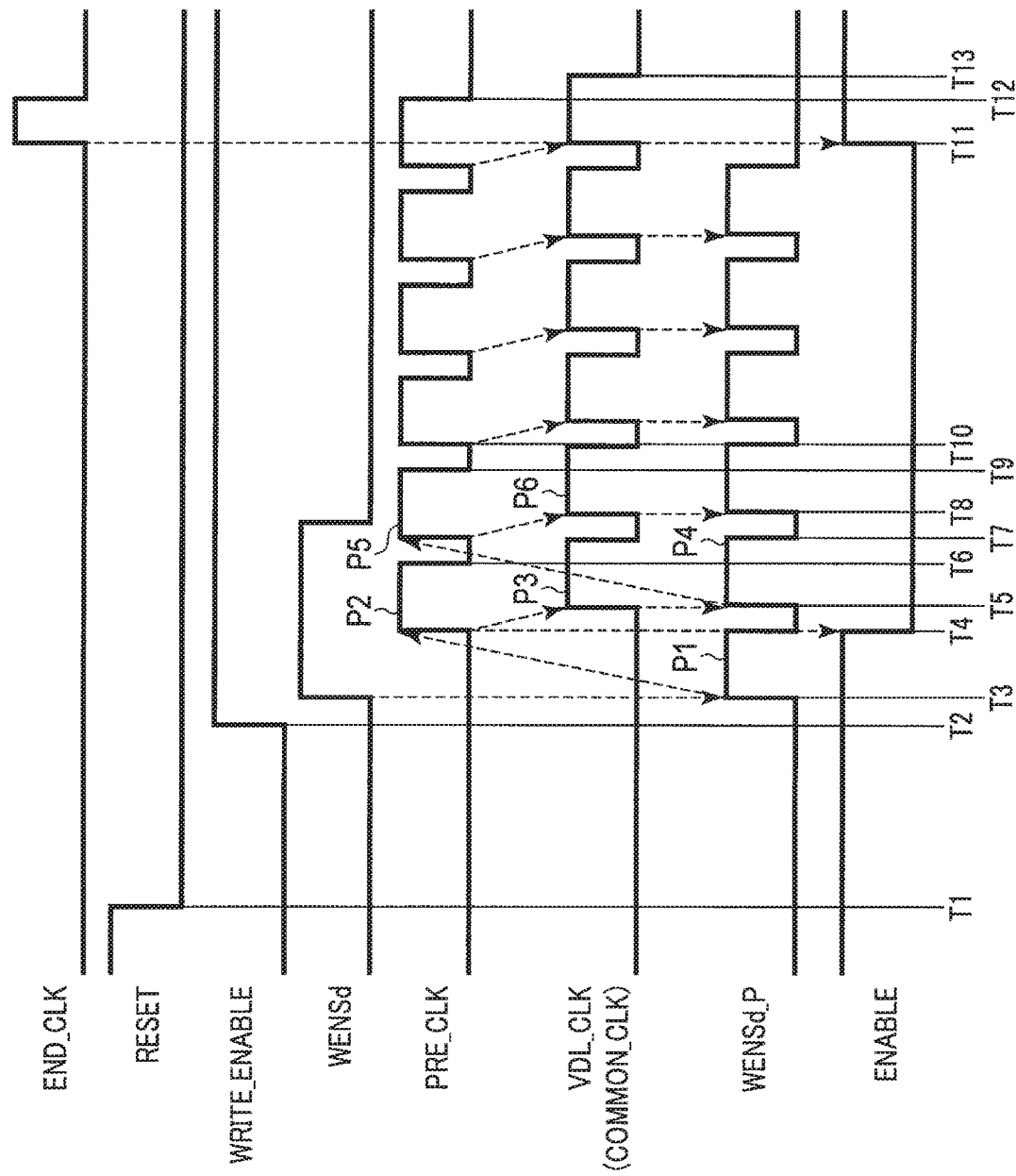
F I G. 12

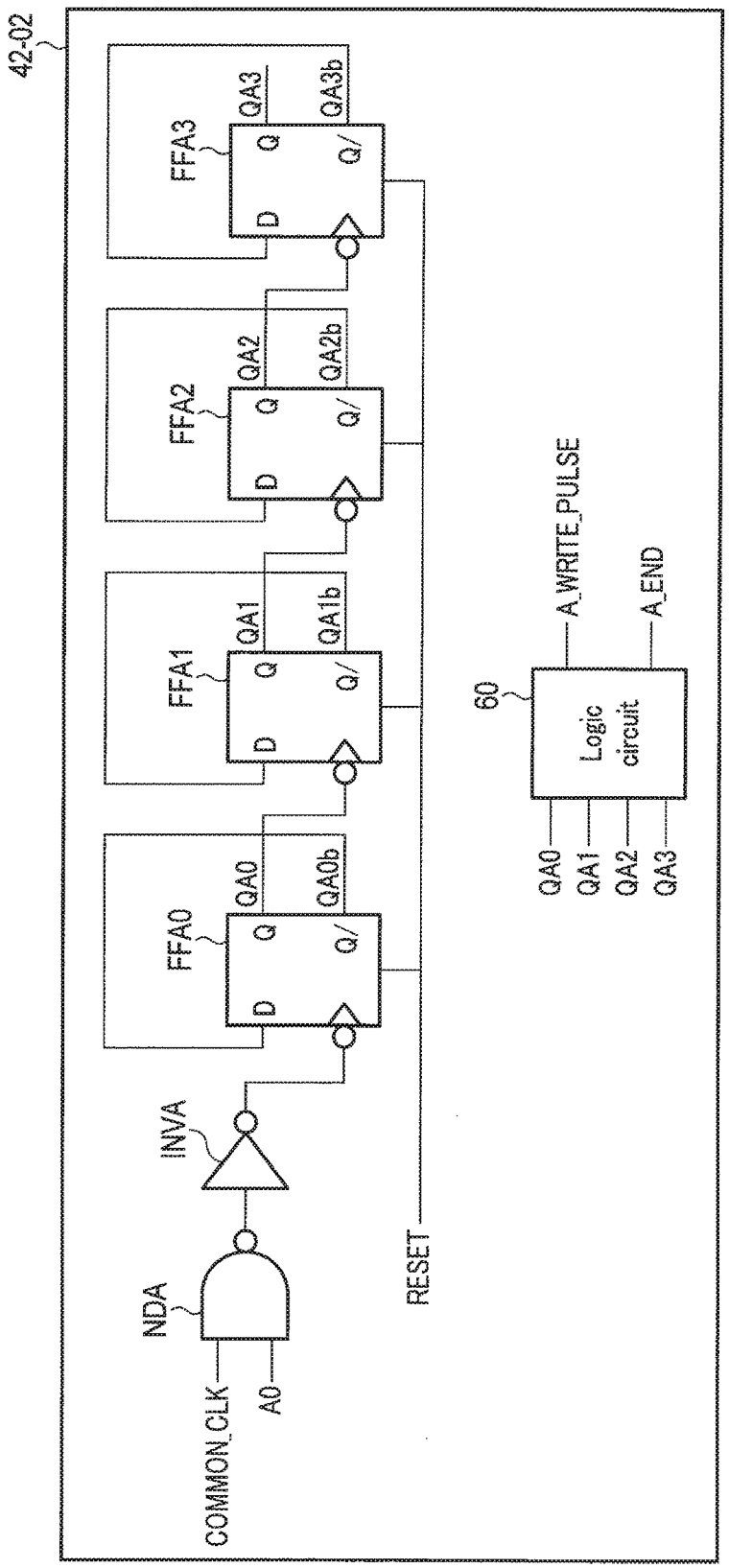
F I G. 14

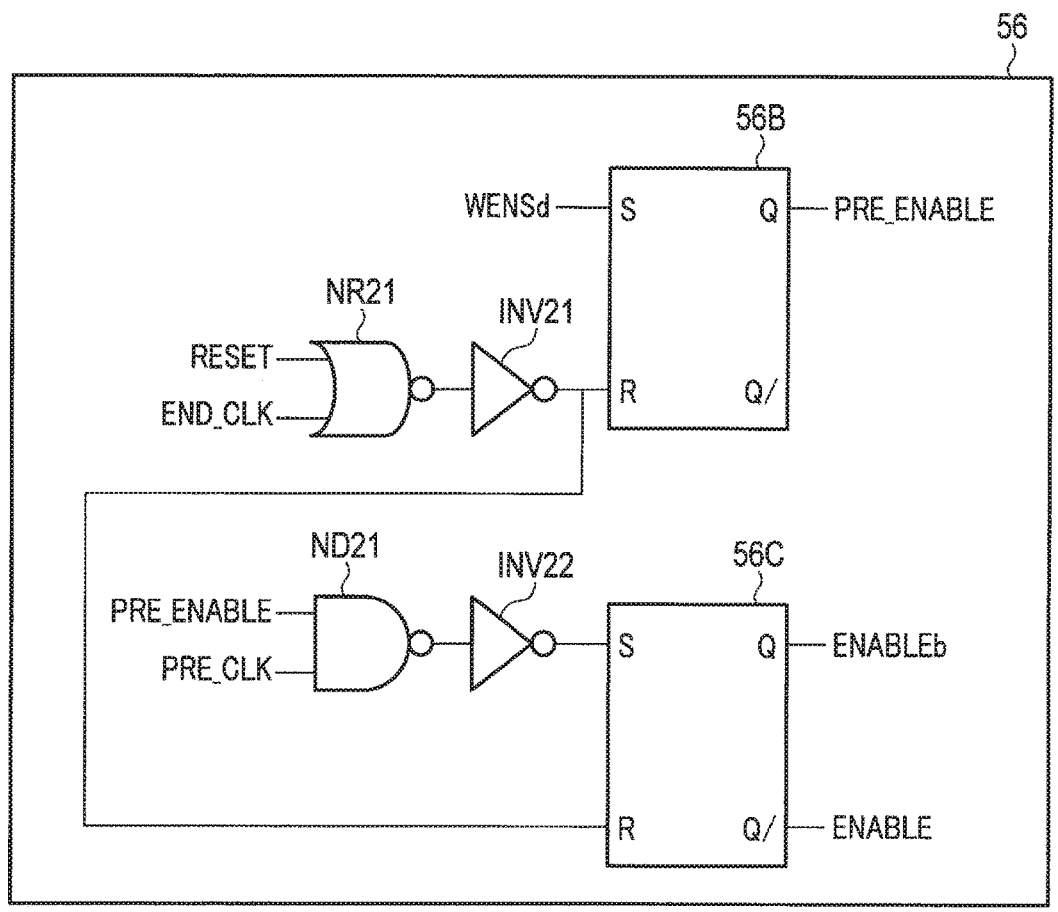
F I G. 17

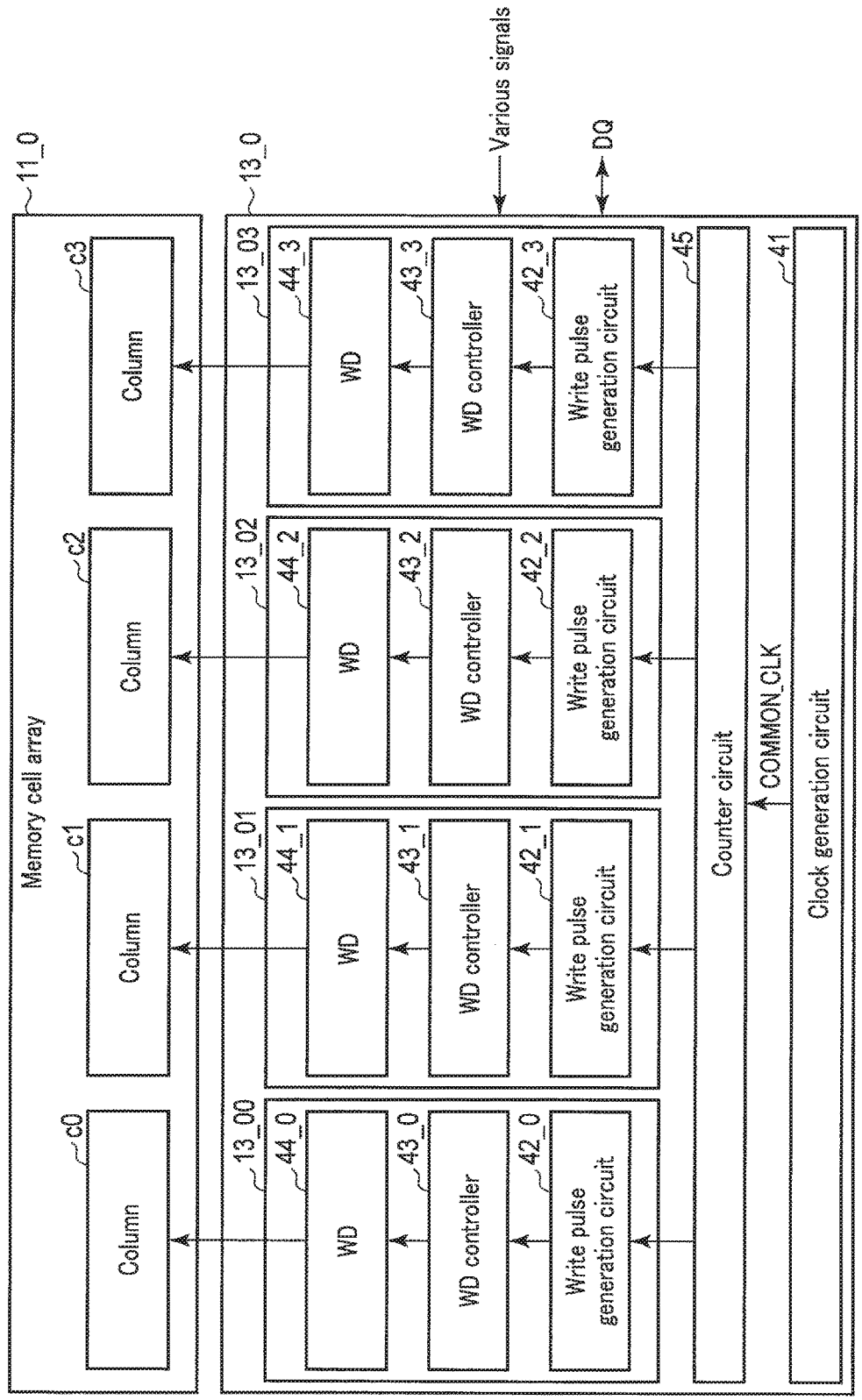
F I G. 19

WRITE PULSE GENERATOR IN A RESISTIVE MEMORY

CROSS REFERENCE TO RELATED APPLICATIONS

This application is based upon and claims the benefit of priority from U.S. Provisional Application No. 62/394,183, filed Sep. 13, 2016, the entire contents of all of which are incorporated herein by reference.

FIELD

Embodiments generally relate to a semiconductor memory device.

BACKGROUND

A Magnetic Random Access Memory (MRAM) is a memory device, in which a memory element having a magnetoresistance effect is used as a memory cell that stores information. The MRAM is noted as a next-generation memory device characterized by high-speed operation, large-capacity and non-volatility.

BRIEF DESCRIPTION OF THE DRAWINGS

FIG. 2 is a diagram showing a memory cell array in the semiconductor memory device according to the first embodiment;

FIG. 3A is a cross-sectional view showing a schematic configuration of a variable resistance element in the semiconductor memory device according to the first embodiment;

FIG. 3B is a drawing to explain writing at the variable resistance element in the semiconductor memory device according to the first embodiment, and showing a cross-sectional view of the variable resistance element in a P state;

FIG. 3C is a drawing to explain writing at the variable resistance element in the semiconductor memory device according to the first embodiment, and showing a cross-sectional view of the variable resistance element in an AP state;

FIG. 4 is a block diagram showing a memory cell array and a read/write circuit in the semiconductor memory device according to the first embodiment;

FIG. 5 is a block diagram showing a clock generation circuit in the semiconductor memory device according to the first embodiment;

FIG. 10 is a block diagram showing a counter circuit in the semiconductor memory device according to the first embodiment;

FIG. 11 is a first example of a timing chart of various signals of the clock generation. circuit in the semiconductor memory device according to the first embodiment;

FIG. 12 is a second example of a timing chart of various signals of the clock generation circuit in the semiconductor memory device according to the first embodiment;

FIG. 14 is a block diagram showing a counter circuit in the semiconductor memory device according to the first embodiment;

FIG. 17 is a block diagram showing a latch circuit in the semiconductor memory device according to the second embodiment;

FIG. 19 is a block diagram showing a memory cell array and a read/write circuit of the semiconductor memory device according to a second embodiment.

DETAILED DESCRIPTION

Figure 1:
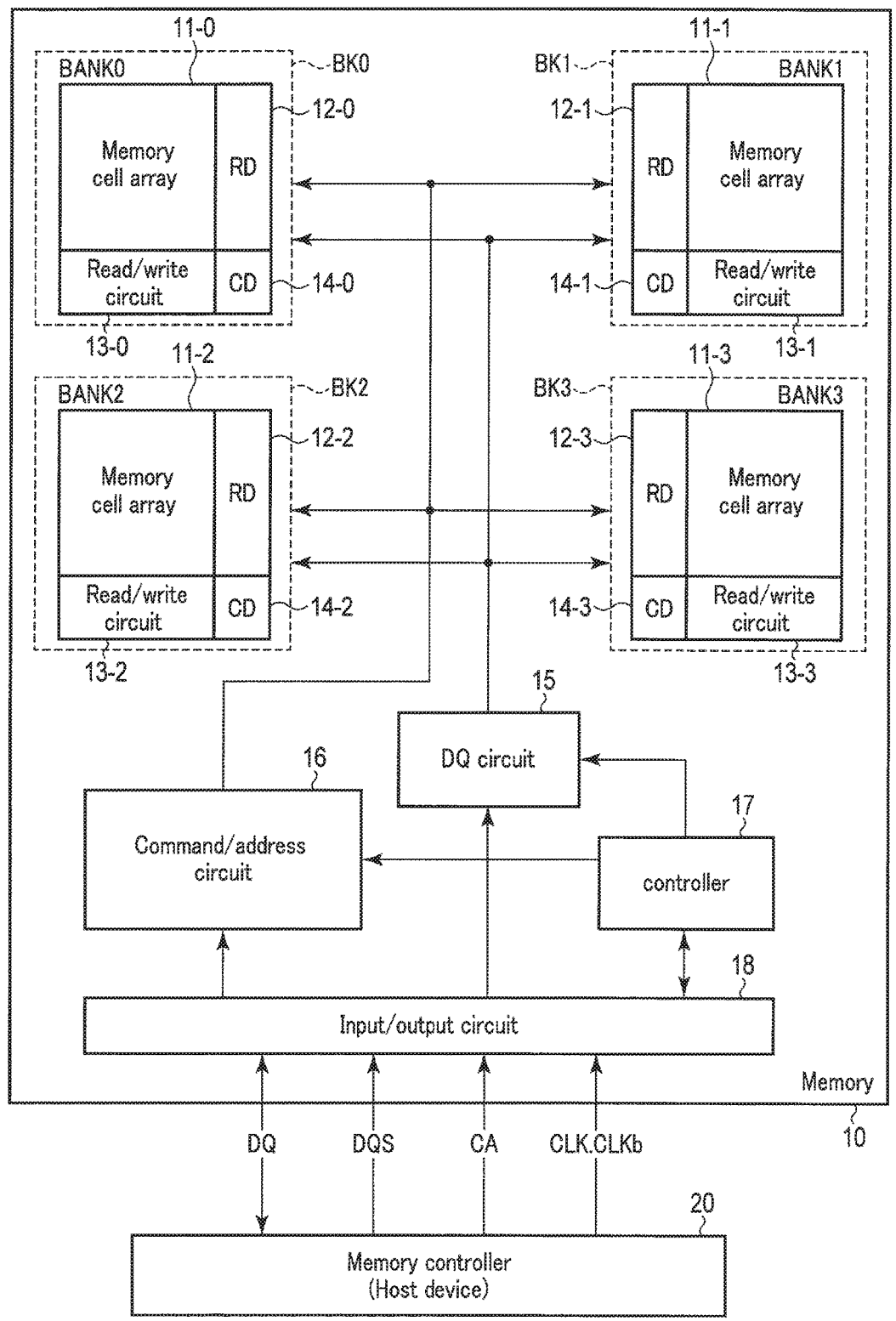
FIG. 1 is a block diagram showing an overall configuration of a semiconductor memory device according to a first embodiment.

In general, according to one embodiment, a semiconductor memory device comprises a memory cell including a variable resistance element; and a first circuit configured to control writing to the memory cell. The first circuit is configured to generate a first pulse of a second signal based on a first signal from outside, generate a second pulse of a third signal obtained by delaying the first pulse, and generate a third pulse of a fourth signal obtained by delaying the second pulse. A falling edge of the first pulse is based on a rising edge of the second pulse. A write pulse is output based on the fourth signal.

Embodiments will be described below with reference to the drawings. In the drawings, identical portions are identified by identical reference symbols.

<First Embodiment>

A semiconductor memory device according to the first embodiment will be explained with reference to FIGS. 1, 2, 3, 4, 5, 6, 7, 8, 9, 10, 11, 12, 13, 14, and 15.

Herein, an MRAM for storing data using a magnetoresistive effect element (Magnetic Tunnel junction (MTJ) element) as a variable resistance element is explained as an example however, the embodiment is not limited to an MRAM. The present embodiment is applicable to any general memory which senses a resistance difference between variable resistance elements by converting the resistance difference into a current difference or a voltage difference.

Note that in the following explanation the term "connect" should be construed to include not only a direct connection but also a connection through any intervening element, unless otherwise mentioned specifically. A first terminal of a transistor represents one of a source or a drain, and a second terminal represents the other of the source or the drain. A control terminal of a transistor represents a gate.

[Configuration Example of MRAM in First Embodiment]

FIG. 1 is a block diagram showing an overall configuration of the semiconductor memory device according to the first embodiment.

As shown in FIG. 1, the semiconductor memory device comprises a memory 10 and a memory controller (host device) 20.

The memory 10 is, for example, an MRAM, a Dynamic Random Access Memory (DRAM), a Resistive Random Access Memory (ReRAM), or a Phase Change Random Access Memory (PCRAM). The following descriptions are based on an example in which the memory 10 is an MRAM.

The memory 10 receives a command/address signal CA, data DQ, a data strobe signal DQS, and clocks CLK/CLKb (external clock) from the memory controller 20. Furthermore, the memory 10 transmits data DQ to the memory controller 20.

The memory controller 20 includes elements such as a Central Processing Unit (CPU), a RAM, and a Read Only Memory (ROM). The memory controller 20 controls the memory 10 in accordance with commands.

The memory 10 comprises banks BK (BK0-BK3), a data circuit 15, a command/address circuit 16, a controller 17, and an input/output circuit 18.

The bank BK0 comprises a memory cell array 11_0, a row decoder 12_0, a read/write circuit 13_0, and a column decoder 14_0. The banks BK1-BK3 comprise a configuration similar to that of the bank BK0; that is, the banks BK1-BK3 respectively comprise memory cell arrays 11_1-11_3, row decoders 12_1-12_3, read/write circuits 13_1-13_3, and column decoders 14_1-14_3. In the following, a configuration of the bank BK0 will be explained as an example. In this explanation, the bank BK is a maximum activation unit selectable from the memory controller 20.

FIG. 2 is a diagram showing the memory cell array 11_0 of the semiconductor memory device according to the first embodiment.

As shown in FIG. 2, the memory cell array 11_0 is provided with bit lines BL (BL0-BL3), source lines SL (SL0-SL3), and word lines WL (WL0-WL3). The bit lines BL and the source lines SL extend in a first direction, and are provided alternately in a second direction perpendicular to the first direction. The word lines WL extend in the second direction. The memory cell array 10 includes a plurality of memory cells MC. Memory cells MC are respectively located at positions where the word lines WL intersect with the bit lines BL and the source lines SL. Thus, the memory cells MC are arrayed in a matrix in the first direction and the second direction. Herein, the bit line BL0 and the source line SL0 are referred to as a column C0, the bit line BL1 and the source line SL1 are referred to as a column C1, the bit line BL2 and the source line SL2 are referred to as a column C2, and the bit line BL3 and the source line BL3 are referred to as a column C3. A set of memory cells MC coupled to one word line WL is called "a page".

The number of columns in the memory cell array 11_0, and the number of bit lines BL, source lines SL, and word lines WL are mere examples, and not limited.

The memory cell MC includes, for example, a variable resistance element R and a select transistor ST. One end of the variable resistance element R is electrically coupled to the bit line BL, and the other end thereof is electrically coupled to a first terminal of the select transistor ST. A second terminal of the select transistor ST is electrically coupled to the source line SL, and a control terminal of the select transistor ST is electrically coupled to the word line WL.

The variable resistance element R is an element in which its resistance value is varied by applying a current (or voltage) to the variable resistor. The variable resistance element R include, for example, an MTJ element, a phase change element, and a ferroelectric element. The memory cell MC is selected by turning on the select transistor ST by the word line WL. In the description, an MRAM using an MTJ element as a variable resistance element R is explained.

FIG. 3A is a cross-sectional view showing a schematic configuration of a variable resistance element R in the semiconductor memory device according to the first embodiment. Herein, as the variable resistance element R, mainly a storage layer 31, a tunnel barrier layer 32, and a reference layer 33 are presented.

As shown in. FIG. 3A, the variable resistance element R includes a laminated body comprising the storage layer 31 which is a ferromagnetic layer, the reference layer 33 which is a ferromagnetic layer, and the tunnel barrier layer 32 which is a non-magnetic layer formed therebetween.

The storage layer 31 is a ferromagnetic layer in which a magnetization direction is variable, and which has perpendicular magnetic anisotropy; that is, the magnetization direction is perpendicular or almost perpendicular to a film surface (upper surface/lower surface). A variable magnetization direction means that a magnetization direction varies with respect to a preset write current. Being almost perpendicular means that a remanent magnetization direction falls within the range of $45°<\theta\leq90°$ with respect to a film surface. The storage layer 31 comprises, for example, cobalt iron boron (CoFeB) or iron boride (FeB).

The tunnel barrier layer 32 is formed on the storage layer 31. The tunnel barrier layer 32 is a non-magnetic layer, and is made of MgO, for example.

The reference layer 33 is formed on the tunnel barrier layer 32. The reference layer 33 is a ferromagnetic layer in which a magnetization direction is non-variable, and which has perpendicular magnetic anisotropy; that is, the magnetization direction is perpendicular or almost perpendicular to a film surface. Herein, a non-variable magnetization direction means that a magnetization direction does not vary with respect to a predetermined write current. In other words, the reference layer 33 has a greater inverted energy barrier of the magnetization direction than the storage layer 31 has. The reference layer 33 comprises, for example, cobalt platinum (CoPt), cobalt nickel (CoNi), or cobalt palladium (CoPd).

FIG. 3B is a drawing to explain write operation at the variable resistance element R in the semiconductor memory device according to the first embodiment, and is a cross-sectional view of the variable resistance element in a parallel state (P state). FIG. 3C is a drawing to explain write operation at the variable resistance element R in the semiconductor memory device according to the first embodiment, and is a cross-sectional view of the variable resistance element in an anti-parallel state (AP state).

The variable resistance element R is, for example, a spin injection type variable resistance element. Accordingly, when data is written to the variable resistance element R, or data is read from the variable resistance element R, a current flows in two ways perpendicular to the film surface in the variable resistance element R.

More specifically, data is written into the variable resistance element R as described below.

As shown in FIG. 3B, when a current flows from the storage layer 31 to the reference layer 33, in other words, when electrons flowing from the reference layer 33 to the storage layer 31 are supplied, the electrons which are spin-polarized in the same direction as the magnetization direction of the reference layer 33 are injected to the storage layer 31. In this case, the magnetization direction of the storage layer 31 is adapted to the same direction as the magnetization direction of the reference layer 33. Accordingly, the magnetization direction of the reference layer 33 and the magnetization direction of the storage layer 31 are in a parallel alignment. In the parallel state, the resistance value of the variable resistance element R is the lowest. This case is defined as "0" data, for example.

On the other hand, as shown in FIG. 3C, when a current flows from the reference layer 33 to the storage layer 31, in other words, when electrons flowing from the storage layer 31 to the reference layer 33 are supplied, the electrons which are spin-polarized in the direction opposite to the magnetization direction of the reference layer 33 are injected to the storage layer 31 because of reflection by the reference layer 33. In this case, the magnetization direction of the storage layer 31 is adapted to the direction opposite to the magnetization direction of the reference layer 33. Accordingly, the magnetization direction of the reference layer 33 and the magnetization direction of the storage layer 31 are in an anti-parallel alignment. In the anti-parallel state, the resistance value of the variable resistance element R is the highest. This case is defined as "1" data, for example.

Data is read out from the variable resistance element R as described below.

A read current is supplied to the variable resistance element R. The read current is set to a value which does not cause the magnetization direction of the storage layer 31 to be inverted (a value smaller than the write current). By detecting a resistance value of the variable resistance element R at this point, the "0" data and "1" data can be read.

Referring back to FIG. 1, the row decoder 12_0 selects a word line WL in accordance with a row address. The column decoder 14_0 selects a bit line EL and a source line SL in accordance with a column address. The read/write circuit 13_0 controls writing to the memory cell array 11_0 and reading from the memory cell array 11_0. The details of the read/write circuit 13_0 will be described later.

The input/output circuit 18 controls signal transmission to and from the memory controller 20. More specifically, the input/output circuit 18 receives a command/address signal CA, data DQ, a data strobe signal DQS, and clocks CLK/CLKb from the memory controller 20. Then, the input/output circuit 18 supplies to the command/address circuit 16 the command/address signal CA and the clocks CLK/CLKb received from the memory controller 20. The input/output circuit 18 transfers to the data circuit 15 the data DQ received from the memory controller 20. The input/output circuit 18 also supplies various control signals to the controller 17.

The command/address circuit 16 receives command/address signals CA from the input/output circuit 18, and supplies signals based on the received signals to the banks BK0-BK3. The command address circuit 16 also receives the clocks CLK/CLKb from the input/output circuit 18, and outputs various signals at timings based on the clocks CLK/CLKb.

The data circuit DQ receives the data DQ from the input/output circuit 18, and transfers it to the banks BK0-BK3.

The controller 17 includes elements such as a voltage generation circuit, and controls the elements based on control signals from the input/output circuit 18.

FIG. 4 is a block diagram showing the memory cell array 11_0 and the read/write circuit 13_0 of the semiconductor memory device according to the first embodiment.

As shown in FIG. 4, the read/write circuit 13_0 comprises first to fourth write circuits 13_00-13_03 and a clock generation circuit 41. The first to fourth write circuits 13_00-13_03 respectively comprise write pulse generation circuits 42_0-42_3, write driver controllers 43_0-43_3, and write drivers 44_0-44_3. The first to fourth write circuits 13_00-13_03 control writing respectively to the columns C0-C3.

The clock generation circuit 41 generates a clock signal COMMON_CLK, which is an internal clock. The clock generation circuit 41 supplies the signal COMMON_CLK to the first write circuit 13_00 (write pulse generation circuit 42_0). The write pulse generation circuit 42_0 receives the signal COMMON_CLK, and generates a write pulse (signal WRITE_PULSE to be described later) based on it. The write driver controller 43_0 receives the write pulse, and performs writing based on it. The write driver 44_0 applies a write voltage to the bit line BL and the source line SL in the column C0 in accordance with the write driver controller 43_0, and causes a write current to flow through the memory cell MC.

Similarly, the clock generation circuit 41 supplies the signal COMMON_CLK to the second to fourth write circuits 13_01-13_03 (write pulse generation circuits 42_1-42_3). Thus, the signal COMMON_CLK is shared by the write circuits 13_00-13_03. The write circuits 13_01-13_03 perform operations similar to the operation of the write circuit 13_00 based on the signal COMMON_CLK.

[Configuration Example of Clock Generation Circuit in First Embodiment]

FIG. 5 is a block diagram showing the clock generation circuit 41 in the semiconductor memory device according to the first embodiment As shown in FIG. 5, the clock generation circuit 41 includes a multiplexer 51, a pulse width limiter circuit 52, delay circuits 53 and 54, a pulse width extender circuit 55, a latch circuit 56, a counter circuit 57, and a level shifter 58.

A signal WENSd based on a write command, a signal WIDER_VDL_CLK from the pulse width extender circuit 55, and signals ENABLE and ENABLEb from the latch circuit 56 are input to the multiplexer 51. The multiplexer 51 selects the signal WENSd or the signal WIDER_VDL_CLK based on the signals ENABLE or ENABLEb. The multiplexer 51 outputs signal PRE_WENSd_P based on the signal WENSd or the signal WIDER_VDL_CLK.

The signal PRE_WENSd_P from the multiplexer 51 is input to the pulse width limiter circuit 52. The pulse width limiter circuit 52 limits and adjusts the maximum pulse width of the signal PRE_WENSd_P. Then, the pulse width limiter circuit 52 outputs the signal WENSd_P.

The signal WENSd_P from the pulse width limiter circuit 52 is input to the delay circuit 53. The delay circuit 53 delays the signal WENSd_P and outputs a signal PRE_CLK.

The signal PRE_CLK from the delay circuit 53 is input to the delay circuit 54. The delay circuit 54 delays the signal PRE_CLK and outputs a signal VDL_CLK.

The signal VDL_CLK from the delay circuit 54 is input to the level shifter 58. A source voltage VDD is supplied to the level shifter 58. The level shifter 58 adjusts a level of the signal VDL_CLK and outputs a signal COMMON_CLK. The signal COMMON_CLK (or the signal VDL_CLK) is an internal clock.

The signal VDL_CLK from the delay circuit 54 is input to the pulse width extender circuit 55. The pulse width of the signal VDL_CLK is varied by the delay circuits 53 and 54 or the like. The pulse width extender circuit 55 extends and adjusts the changed pulse width of the signal VDL_CLK, and outputs the signal WIDER_VDL_CLK.

The signal PRE_CLK from the delay circuit 53 and a signal END_CLK from the counter circuit 57 are input to the latch circuit 56. Signals RESET and WRITE ENABLE based on the write command are also input to the latch circuit 56. The latch circuit 56 outputs the signals ENABLE and ENABLEb. At this time, the latch circuit 56 controls an H (High) level or an L (Low) level of the signals ENABLE and ENABLEb based on the signals RESET, WRITE_E-ABLE, PRE_CLK, and END_CLK.

The signal VDL_CLK from the delay circuit 54 is input to the counter circuit 57. The signal RESET based on the write command is also input to the counter circuit 57. The counter circuit 57 outputs the signal END_CLK. At this time, the counter circuit 57 counts the pulse number of the signal VDL_CLK. The counter circuit 57 makes the signal END_CLK the H level, when the pulse number of the signal VDL_CLK reaches a predetermined number.

Each of the elements of the semiconductor memory device will be detailed below. In the following explanation, a signal b denotes an inversion signal.

Figure 6:
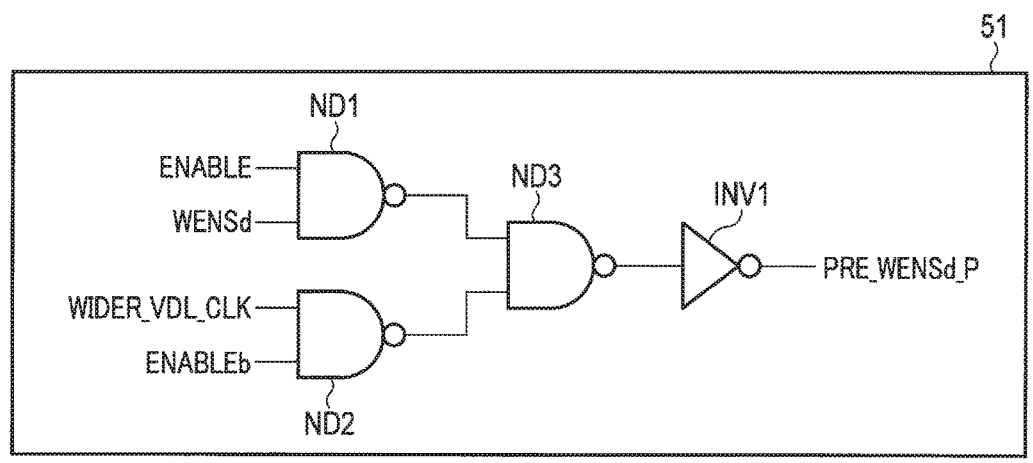
FIG. 6 is a block diagram showing a multiplexer in the semiconductor memory device according to the first embodiment.

FIG. 6 is a block diagram of the multiplexer 51 in the semiconductor memory device according to the first embodiment.

As shown in FIG. 6, the multiplexer 51 includes NAND gates ND1, ND2 and ND3, and an inverter INV1.

The signal ENABLE from the latch circuit 56 and the signal WENSd based on the write command are input to the NAND gate ND1. The signal ENABLEb from the latch circuit 56 and the signal WIDER_VDL_CLK from the pulse width extender 55 are input to the NAND gate ND2. An output of the NAND gate ND1 and an output of the NAND gate ND2 are input to the NAND gate ND3. An output of the NAND gate NAD3 is input to the inverter INV1. An output of the inverter INV1 is the signal PRE_WENSd_P.

Figure 7:
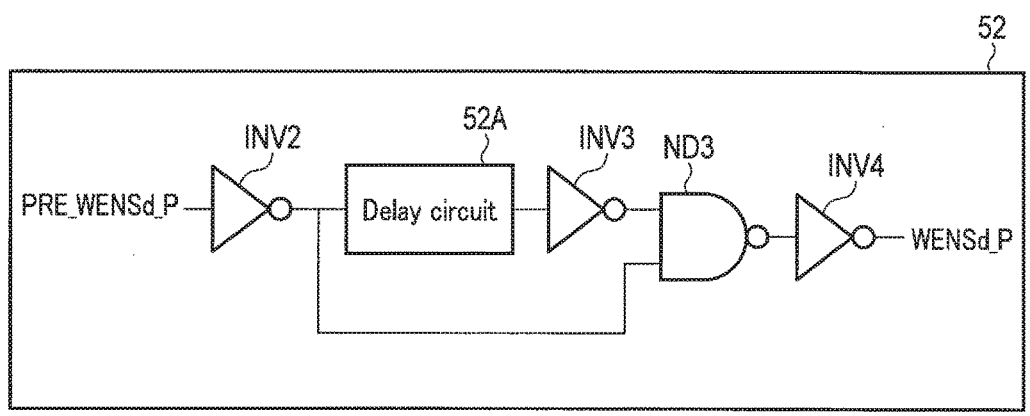
FIG. 7 is a block diagram showing a pulse width limiter circuit in the semiconductor memory device according to the first embodiment.

FIG. 7 is a block diagram showing the pulse width limiter circuit 52 in the semiconductor memory device according to the first embodiment.

As shown in FIG. 7, the pulse width limiter 52 includes inverters INV2, INV3, INV4, a NAND gate ND3, and a delay circuit 52A.

The signal PRE_WENSd_P from the multiplexer 51 is input to the inverter INV2. An output of the inverter INV2 input to the delay circuit 52A. An output of the delay circuit 52A is input to the inverter INV3. An output of the inverter INV3 and an output of the inverter INV2 are input to the NAND gate ND3. An output of the NAND gate ND3 is input to the inverter INV4. An output of the inverter INV4 is the signal WENSd_P.

Figure 8:
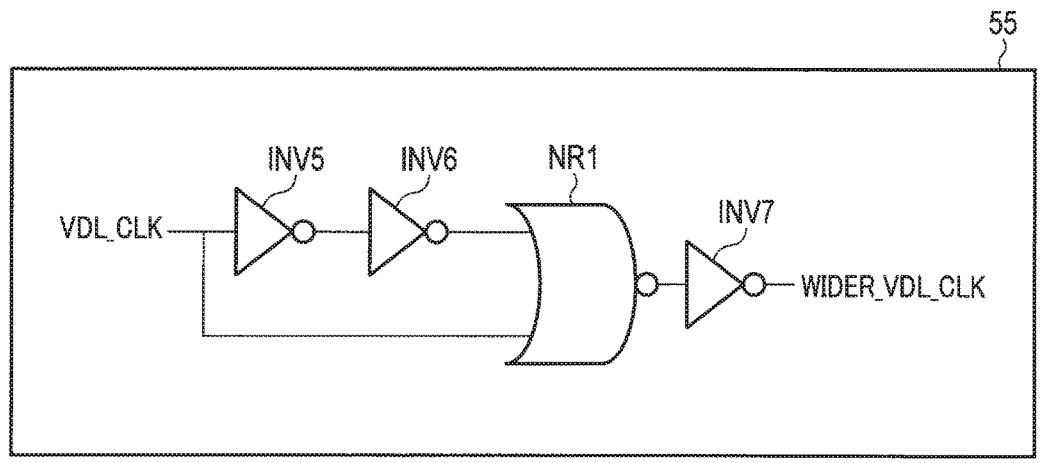
FIG. 8 is a block diagram showing a pulse width extender circuit in the semiconductor memory device according to the first embodiment.

FIG. 8 is a block diagram showing the pulse width extender circuit 55 in the semiconductor memory device according to the first embodiment.

As shown in FIG. 8, the pulse width extender circuit 55 includes inverters INV5, INV6, INV7, and a NOR gate NR1.

The signal VDL_CLK from the delay circuit 54 is input to the inverter INV5. An output of the inverter INV5 is input to the inverter INV6. An output of the inverter INV6 and the signal VDL_CLK are input to the NOR gate NR1. An output of the NOR gate NR1 is input to the inverter INV7. An output of the inverter INV7 is the signal WIDER_VDL_CLK.

Figure 9:
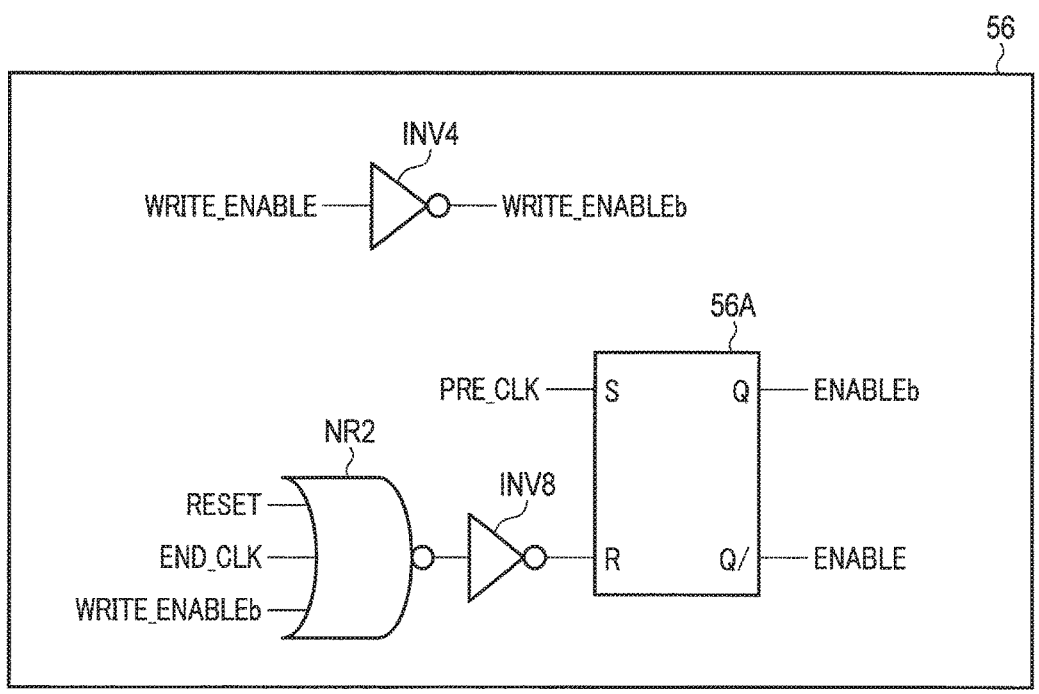
FIG. 9 is a block diagram showing a latch circuit in the semiconductor memory device according to the first embodiment.

FIG. 9 is a block diagram showing the latch circuit 56 in the semiconductor memory device according to the first embodiment.

As shown in FIG. 9, the latch circuit 56 includes a NOR gate NR2, inverters INV8 and INV9, and an SR latch 56A.

The inverter INV9 inverts a signal WRITE_ENABLE based on the write command and outputs a signal WRITE_ENABLEb. The signal RESET, the signal END_CLK from the counter circuit 57, and the signal WRITE_ENABLEb are input to the NOR gate NR2. An output of the NOR gate NR2 is input to the inverter INV8.

An output of the inverter INV8 is input to a set terminal of the SR latch 56A, and the signal PRE_CLK from the delay circuit 53 is input to a reset terminal of the SR latch 56A. The SR latch 56A outputs the signal ENABLE from an output terminal Q/, and outputs the signal ENABLEb from an output, terminal Q.

FIG. 10 is a block diagram showing the counter circuit 57 in the semiconductor memory device according to the first embodiment.

As shown in FIG. 10, the counter circuit 57 includes a NAND gate ND4, an inverter INV10, flip-flops FF0-FF3, and a logic circuit 57A.

The signal VDL_CLK from the delay circuit 54 and the signal ENABLE from the latch circuit 56 are input to the NAND gate ND4. An output of the NAND gate ND4 is input to the inverter INV10.

An output from the inverter INV10 is input as a clock to the flip-flop FF0. A signal Q0b from an output terminal Q/ of the flip-flop FF0 is input to an input terminal D of the flip-flop FF0. Furthermore, the flip-flop FF0 outputs a signal Q0 from an output terminal Q.

A signal from an output terminal Q of the former flip-flop is input as a clock to each of the subsequent flip flops FF1-FF3.

The signal Q0 from the output terminal Q of the flip-flop FF0 is input as a clock to the flip-flop FF1. A signal Q1b from an output terminal Q/ of the flip-flop FF1 is input to an input terminal D of the flip-flop FF1. Furthermore, the flip-flop FF1 outputs a signal Q1 from an output terminal Q.

The signal Q1 from the output terminal Q of the flip-flop FF1 is input as a clock to the flip-flop FF2. A signal Q2b from an output terminal Q/ of the flip-flop FF2 is input to an input terminal D of the flip-flop FF2. Furthermore, the flip-flop FF2 outputs a signal Q2 from an output terminal Q.

The signal Q2 from the output terminal Q of the flip-flop FF2 is input as a clock to the flip-flop FF3. A signal Q3b from an output terminal Q/ of the flip-flop FF3 is input to an input terminal D of the flip-flop FF3. Furthermore, the flip-flop FF3 outputs a signal Q3 from an output terminal Q.

The flip-flops FF0-FF3 are reset by input of the signal RESET to the flip-flops FF0-FF3.

The signals Q0-Q3 from the flip-flops FF0-FF3 are input to the logic circuit 57A. The logic circuit 57A performs the aforementioned logical operations, and outputs the signal END_CLK as a result. More specifically, the logic circuit 57A counts the pulse number of the signal VDL_CLK from the signals Q0-Q3 of the flip-flops FF0-FF3. The logic circuit 57A makes the signal END_CLK the H level, when the pulse number reaches a predetermined number.

[Operation Example of Clock Generation Circuit in First Embodiment]

An operation example of the clock generation circuit 41 will be explained with reference to FIGS. 5 and 11.

FIG. 11 is a first example of a timing chart of various signals of the clock generation circuit 41 in the semiconductor memory device according to the first embodiment.

As shown in FIG. 11, at time T3, a pulse P1 of the signal WENSd_P is generated in accordance with a rising edge of the signal WENSd. Then, at time T4, a pulse P2 of the delayed signal PRE_CLK is generated based on the pulse P1. Furthermore, at time T5, a pulse P3 of the further delayed signal VDL_CLK (COMMON_CLK) is generated based on the pulse P2. The pulse P3 of the signal VDL_CLK is output as a first pulse of an internal clock. The pulse P3 is also fed back and a pulse P4 of the signal WENSd_P is generated based on the fed back pulse P3. Subsequently, in the same manner as described above, at time T7, a pulse P5 of the delayed signal PRE_CLK is generated based on the pulse P4. At time T8, a pulse P6 of the further delayed signal VDL_CLK is generated based on the pulse P5. The pulse P6 of the signal VDL_CLK is output as a second pulse of the internal clock.

Thus, in the internal clock (signal VDL_CLK) of this example, a pulse is generated first in accordance with the rising edge of the signal WENSd. Then, subsequent pulses are generated by feedback (loop) of the generated pulse. The timing chart of various signals of the clock generation circuit 41 will be explained in more detail.

As shown in FIGS. 5 and 11, in the first example, at the time T1, the signal RESET becomes the L level when a write command is input from outside. Accordingly, the latch circuit 56 and the counter circuit 57 are reset. Then, at the time T2, the signal WRITE_ENABLE becomes the H level. Further, at the time T3, the signal WENSd becomes the H level.

At this time, the signals END_CLK, RESET, WRITE_ENABLE, and PRE_CLK of the L level are input to the latch circuit 56. Accordingly, the latch circuit 56 makes the signal ENABLE the H level (makes the signal ENABLEb the L level). When the signal ENABLE of the H level (the signal ENABLEb of the L level) is input to the multiplexer 51, the multiplexer 51 selects the signal WENSd. Accordingly, the pulse width limiter circuit 52 makes the signal WENSd_P the H level based on the signal WENSd of the H level.

Thereafter, when the signal WENSd_P of the H level is input to the delay circuit 53, the delay circuit 53 makes the signal PRE_CLK the H level at the time T4. When the signal PRE_CLK of the H level is input to the latch circuit 56, the latch circuit 56 makes the signal ENABLE the L level (makes the signal ENABLEb the H level). When the signal ENABLE of the L level (the signal ENABLEb of the H level) is input to the multiplexer 51, the multiplexer 51 ceases selecting the signal WENSd and selects the signal VDL_CLK (WIDER_VDL_CLK). Accordingly, the pulse width limiter circuit 52 makes the signal WENSd_P the L level based on the signal VDL_CLK of the L level.

Thus, the pulse width limiter circuit 52 generates the pulse P1 of the signal WENSd_P from the time T3 to the time T4. The time period from the time T3 the time T4 corresponds to a time difference between the rising edge of the signal WENSd_P and the rising edge of the signal PRE_CLK, that is, the time delayed by the delay circuit 53.

The delay circuit 53 generates the pulse P2 of the signal PRE_CLK from the time T4 to the time T6 based on the pulse P1 of the signal WENSd_P. Thereafter, the delay circuit 54 generates the pulse P3 of the signal VDL_CLK from the time T5 to the time T7 based on the pulse P2 of the signal PRE_CLK. At this time, since the multiplexer 51 selects the signal VDL_CLK, the pulse width limiter circuit 52 generates the pulse P4 of the signal WENSd_P based on the pulse P3 of the signal VDL_CLK.

In the same manner as described above, the delay circuit 53 generates the pulse P5 of the signal PRE_CLK from the time T7 to time TO based on the pulse P4 of the signal WENSd_P. The delay circuit 54 generates the pulse P6 of the signal VDL_CLK from the time T8 to time T10 based on the pulse P5 of the signal PPE_CLK. Similarly, pulses of the signals WENSd_P, PRE_CLK, and VDL_CLK are subsequently generated.

Then, at time T11, the signal WRITE_ENABLE becomes the L level. Accordingly, the latch circuit 56 makes the signal ENABLE the L level (makes the signal ENABLEb the level). When the signal ENABLE of the L level (the signal ENABLEb of the H level) is input to the multiplexer 51, the multiplexer 51 selects the signal WENSd. Since the signal WENSd has already been the L level, the pulse width limiter circuit 52 makes the signal WENSd_P the L level in accordance with the signal WENSd of the L level, and stops oscillation of the signal WENSd_P.

The delay circuit 53 makes the signal PRE_CLK the L level in accordance with the signal WENSd_P of the L level at time T12. The delay circuit 54 makes the signal VDL_CLK the L level in accordance with the signal PRE_CLK of the L level at time T13.

In this manner, pulses of the internal clock (signal VD1_CLK) of the first example are generated.

FIG. 12 is a second example of a timing chart of various signals of the clock generation circuit 41 in the semiconductor memory device according to the first embodiment.

In the first example described above, generation of an internal clock is completed in accordance with a falling edge (the time T11) of the signal WRITE_ENABLE based on the write command. In other words, generation of an internal clock is completed in accordance with completion of writing. In contrast, in the second example, pulses of an internal clock are counted, and generation of the internal clock is completed when the count reaches a predetermined number. In this example, generation of the internal clock is completed, when, for example, a sixth pulse of the internal clock is counted.

As shown in FIG. 12, pulses of an internal clock (signal VDL_CLK) of the second example are generated from time T1 to T10, in the same manner as in the first example described above.

At time T11, a delay circuit 54 makes the signal VDL_CLK an H level. A counter circuit 57 counts pulses (rising edges) of the signal VDL_CLK, and recognizes a sixth pulse. As a result, the counter circuit 57 makes the signal END_CLK the H level based on the pulse as a trigger. When the signal END_CLK of the H level is input to the latch circuit 56, the latch circuit 56 makes the signal ENABLE the L level (makes the signal ENABLEb the H level).

When the signal ENABLE of the L level (the signal ENABLEb of the H level) is input to the multiplexer 51, the multiplexer 51 selects the signal WENSd. Since the signal WENSd has already been the L level, the pulse width limiter circuit 52 maintains the signal WENSd_P at the L level in accordance with the signal WENSd of the L level, and stops oscillation of the signal WENSd_P. As a result, the delay circuit 53 makes the signal PRE_CLK the L level in accordance with the signal WENSd_P of the L level at the time T12. The delay circuit 54 makes the signal VDL_CLK the L level in accordance with the signal PRE_CLK of the L level at the time T13.

In this manner, pulses of the internal clock (signal VDL_CLK) of the second example are generated.

[Configuration Example of Write Pulse Generation Circuit in First Embodiment]

Figure 13:
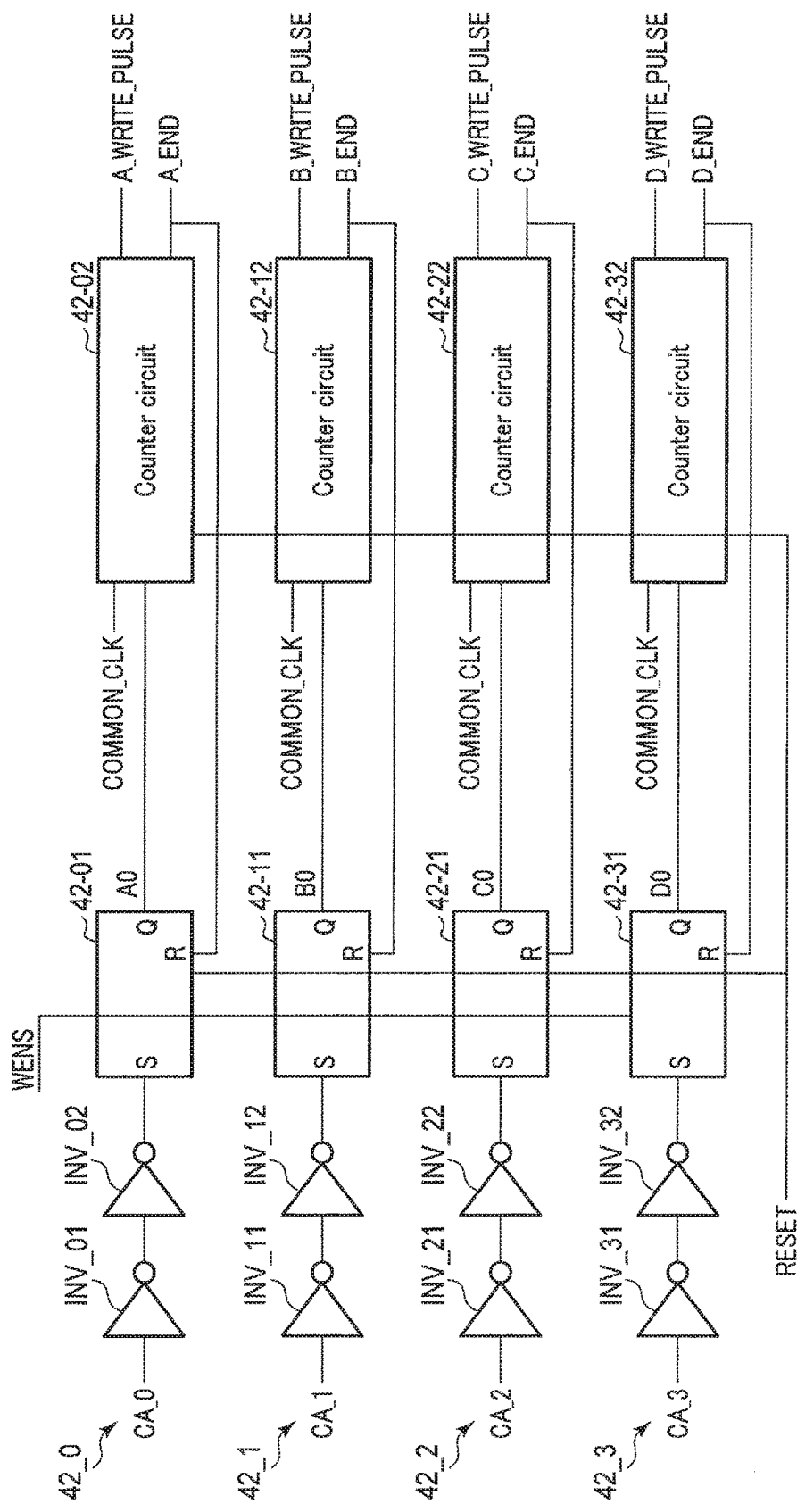
FIG. 13 is a block diagram showing a write pulse generation circuit in the semiconductor memory device according to the first embodiment.

FIG. 13 is a block diagram showing the write pulse generation circuit 42_0-42_3 in the semiconductor memory device according to the first embodiment.

As shown in FIG. 13, the write pulse generation circuit 42_0 comprises inverters INV_01 and INV_02, an SR latch 42_01, and a counter circuit 42_02.

An address signal CA_O is input to the inverter INV_01. An output of the inverter INV_01 is input to the inverter INV_02.

An output of the inverter INV_02 is input to a set terminal of the SR latch 42_01, and a signal RESET or a signal A_END from the counter circuit 42_02 is input to a reset terminal of the SR latch 42_01. The SR latch 42_01 outputs a signal A0 from an output terminal Q.

The signal A0 from the SR latch 42_01 and a signal COMMON_CLK from the clock generation circuit 41 are input to the counter circuit 42_02. The signal RESET is also input to the counter circuit 42_02. The counter circuit 42_02 counts the pulse number of the signal COMMON_CLK. The counter circuit 42_02 generates a write pulse (signal A_WRITE_PULSE) corresponding to the pulse number of the signal COMMON_CLK. The counter circuit 42_02 outputs the signal A_END of the H level, when the pulse number of the signal COMMON_CLK reaches a predetermined number.

The write pulse generation circuits 42_1-42_3 have configurations similar to that of the write pulse generation circuit 42_0, and explanations thereof are omitted if appropriate. The write pulse generation circuit 42_1 comprises inverters INV_11 and INV_12, an SR latch 42_11, and a counter circuit 42_12. The write pulse generation circuit 42_2 comprises inverters INV_21 and INV_22, an SR latch 42_21, and a counter circuit 42_22. The write pulse generation circuit 42_3 comprises inverters INV_31 and INV_32, an SR latch 42_31, and a counter circuit 42_32. Address signals CA_1-CA_3 are respectively input to the inverters INV_11-INV_31. The SR latches 42_11-42_31 respectively output signals B0-D0. The signals B0-D0 are respectively input to the counter circuits 42_12-42_32, and a common signal COMMON_CLK is input to them. The counter circuits 42_12-42_32 respectively output signals B_WRITE_PULSE-D_WRITE_PULSE, and respectively output signals B_END-D_END.

FIG. 14 is a block diagram showing the counter circuit 42_02 in the semiconductor memory device according to the first embodiment.

As shown in FIG. 14, the counter circuit 42_02 includes a NAND gate NDA, an inverter INVA, flip-flops FFA0-FFA3, and a logic circuit 60.

The signal A0 from the SR latch 42_01 and the signal COMMON_CLK from the clock generation circuit 41 are input to the NAND gate NDA. An output of the NAND gate ND4 is input to the inverter INVA.

An output from the inverter INVA is input as a clock to the flip-flop FFA0. A signal QA0b from an output terminal Q/ of the flip-flop FFA0 is input to an input terminal D of the flip-flop FFA0. Furthermore, the flip-flop FFA0 outputs a signal QA0 from an output terminal Q.

A signal from an output terminal Q of the former flip-flop is input as a clock to each of the subsequent flip-flops FFA1-FFA3.

The signal QA0 from the output terminal Q of the flip-flop FFA0 is input as a clock to the flip-flop FFA1. A signal QA1b from an output terminal Q/ of the flip-flop FFA1 is input to an input terminal. D of the flip-flop FFA1. Furthermore, the flip-flop FFA1 outputs a signal QA1 from an output terminal Q.

The signal QA1 from the output terminal Q of the flip-flop FFA1 is input as a clock to the flip-flop FFA2. A signal QA2b from an output terminal Q/ of the flip-flop FFA2 is input to an input terminal U of the flip-flop FFA2. Furthermore, the flip-flop FFA2 outputs a signal QA2 from an output terminal Q.

The signal QA2 from the output terminal Q of the flip-flop FFA2 is input as a clock to the flip-flop FFA3. A signal QA3b from an output terminal Q/ of the flip-flop FFA3 is input to an input terminal D of the flip-flop FFA3. Furthermore, the flip-flop FFA3 outputs a signal QA3 from an output terminal Q.

The flip-flops FFA0-FFA3 are reset by input of the signal RESET to the flip-flops FFA0-FFA3.

The signals QA0-QA3 from the flip-flops FFA0-FFA3 are input to the logic circuit 60. The logic circuit 60 performs the aforementioned logical operations, and outputs the signal WRITE_PULSE and the signal A_END. More specifically, the logic circuit 60 counts the pulse number of the signal COMMON_CLK from the signals QA0-QA3 of the flip-flops FFA0-FFA3. The counter circuit 42_02 generates a write pulse (signal A_WRITE_PULSE) corresponding to the pulse number of the signal COMMON_CLK. The counter circuit 42_02 outputs the signal A_END of the H level, when the pulse number of the signal COMMON_CLK reaches a predetermined number.

[Operation Example of Write Pulse Generation Circuit in First Embodiment]

An operation example of the write pulse generation circuit 42_0 will he explained with reference to FIGS. 13 and 15.

Figure 15:
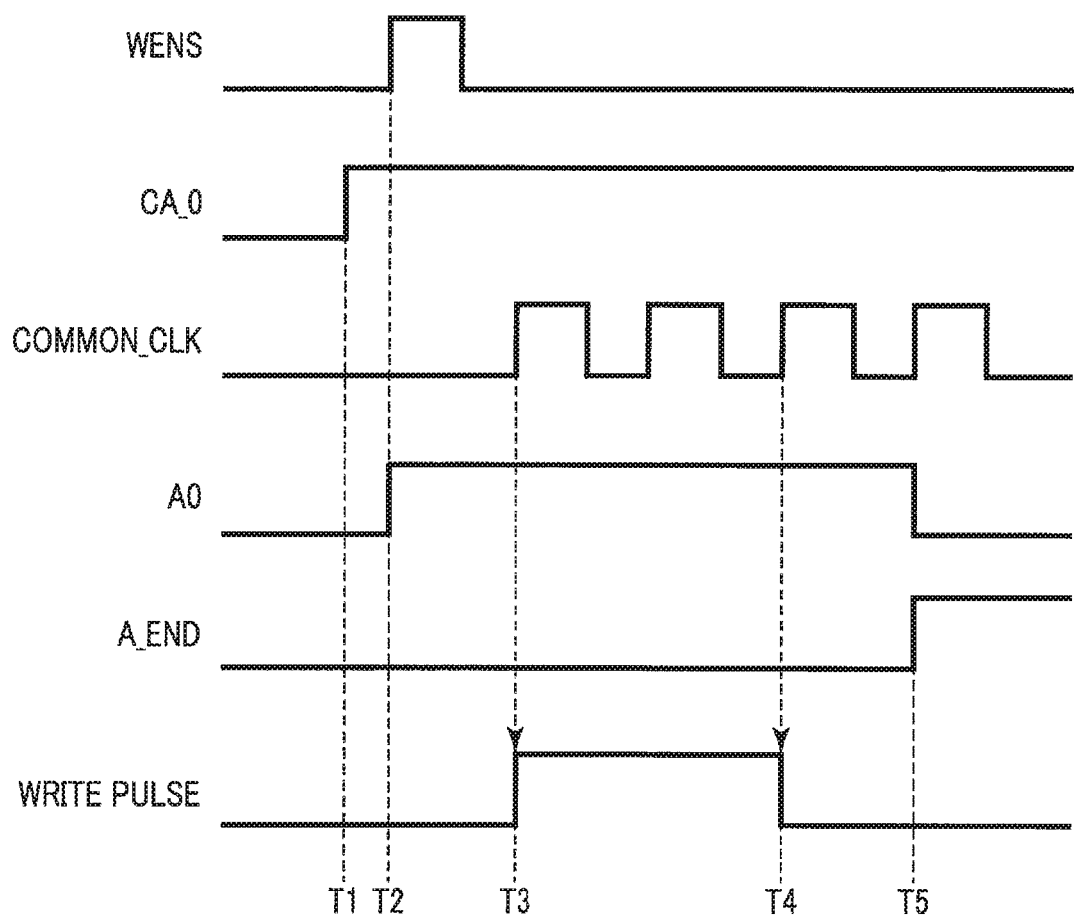
FIG. 15 is a timing chart of various signals of the write pulse generation circuit in the semiconductor memory device according to the first embodiment.

FIG. 15 is a timing chart of various signals of the write pulse generation circuit 42_0 in the semiconductor memory device according to the first embodiment.

As shown in FIGS. 13 and 15, the address signal CA_0 becomes the H level at time T1. Then, at time T2, the signal WENS becomes the H level. When the signal WENS of the H level is input in a state where the address signal CA_0 of the H level has been input to the SR latch 42_01, the SR latch 42_01 makes the signal A0 the H level.

Then, at time T3, input of a pulse of the signal COMMON_CLK starts in a state where the signal A0 of the H level has been input to the counter circuit 42_02. As a result, the counter circuit 42_02 makes the signal WRITE_PULSE the H level based on a rising edge of a first pulse of the signal COMMON_CLK as a trigger. The counter circuit 42_02 starts counting the pulse (rising edge) of the signal COMMON_CLK.

Then, at time T4, the counter circuit 42_02 recognizes a third pulse of the signal COMMON_CLK. The counter circuit 42_02 makes the signal WRITE_PULSE the L level based on the pulse as a trigger. As a result, the signal WRITE_PULSE can be at the H level (a write pulse can be generated) from time T3 to T4.

Then, at time T5, the counter circuit 42_02 recognizes a fourth pulse of the signal COMMON_CLK. The counter circuit 42_02 makes the signal A_END the H level based on the pulse as a trigger. When the signal A_END of the H level is input to the SR latch 42_01, the SR latch 42_01 makes the signal A0 the L level.

In this manner, write pulses based on the internal clock (signal COMMON_CLK) are generated. In this example, the write pulses are generated based on three pulses of the signal COMMON_CLK; however, the pulse width of the write pulses can be appropriately changed by changing the number of pulses of the signal COMMON_CLK.

[Effect in First Embodiment]

An MRAM is expected as an alternative of a volatile memory, such as a DRAM. The MRAM requires a write pulse longer than that of a volatile memory for writing. The write pulse is set in accordance with a pulse of an internal clock as a trigger. Therefore, the length (pulse width) of the write pulse depends on the pulse number (cycle number) of the internal clock. For example, the length of the write pulse is equal to an integral multiple of the cycle number of the internal clock. Therefore, to flexibly set the length of the write pulse, it is necessary to shorten the cycle of the internal clock, that is, to reduce the pulse width of the internal clock.

A CR oscillation circuit is used as a method for generating an internal clock. However, it is difficult to shorten the cycle of an internal clock by a CR oscillation circuit.

Meanwhile, a method for generating an internal clock by serially connecting a plurality of delay circuits is proposed (a comparative example). More specifically, in the comparative example, when any pulse is input to a delay circuit, a delayed pulse (first pulse) is generated, and the first pulse is input to a next delay circuit. Then, a further delayed pulse (second pulse) is input to a next-step delay circuit. The first pulse and the second. pulse compose an internal clock. A time period between the first pulse and the second pulse is a cycle of the internal clock.

In the comparative example, the cycle of the internal clock can be shortened by shortening the delay time of the delay circuit. Therefore, the length of the write pulse can be flexibly set. However, as described above, one delay circuit is required to generate one cycle (one pulse) of an internal clock. Therefore, to generate a long write pulse, an internal clock including many pulses is required, and many delay circuits are required. Accordingly, the circuit area must be large.

In contrast, according to the first embodiment, the clock generation circuit 41 delays a pulse of the signal WENSd input to the multiplexer 51 with the delay circuits 53 and 54, thereby generating a first pulse of the signal VDL_CLK. The first pulse of the signal VDL_CLK is output as the internal clock and also fed back to the multiplexer 51. The clock Generation circuit 41 delays the first pulse of the signal VDL_CLK input (fed back) to the multiplexer 51 with the delay circuits 53 and 54, thereby generating a second pulse of the signal VDL_CLK. The second pulse of the signal VDL_CLK is output as the internal clock and also input to the multiplexer 51.

Thus, in the first embodiment, the pulse of the signal VDL_CLK is looped, so that new pulses of the signal VDL_CLK are sequentially generated. As a result, an internal clock including a plurality of pulses is generated. Accordingly, unlike the comparative example, the first embodiment does not need to increase the delay circuit according to the pulse number of the internal clock. Therefore, an increase of the circuit area can be suppressed.

Moreover, a pulse of the signal PRE_CLK is generated by delaying a pulse of the signal WENSd with the delay circuit 53. At this time, the input to the multiplexer 51 is switched from the signal WENSd to the signal VDL_CLK in accordance with a pulse of the signal PRE_CLK as a trigger. In other words, the signal output from the multiplexer 51 is forced to oscillate by the pulse of the signal PRE_CLK regardless of the pulse width of the signal WENSd. Thus, the pulse width of the signal VDL_CLK as the internal clock can be reduced regardless of the pulse width of the signal WENSd. Consequently, the length of the write pulse can be flexibly set.

<Second Embodiment>

A semiconductor memory device according to the second embodiment will be explained with reference to FIG. 16 to FIG. 18.

In the first embodiment, the clock generation circuit 41 common to the columns C0-C3 is provided to generate a common internal clock (signal COMMON_CLK). In contrast, in the second embodiment, clock generation circuits 41_0-41_3 are respectively provided for columns C0-C3.

With regard to the second embodiment, explanations on the matters which are the same as in the first embodiment are omitted, and mainly the matters which are different are explained.

[Configuration Example in Second Embodiment]

Figure 16:
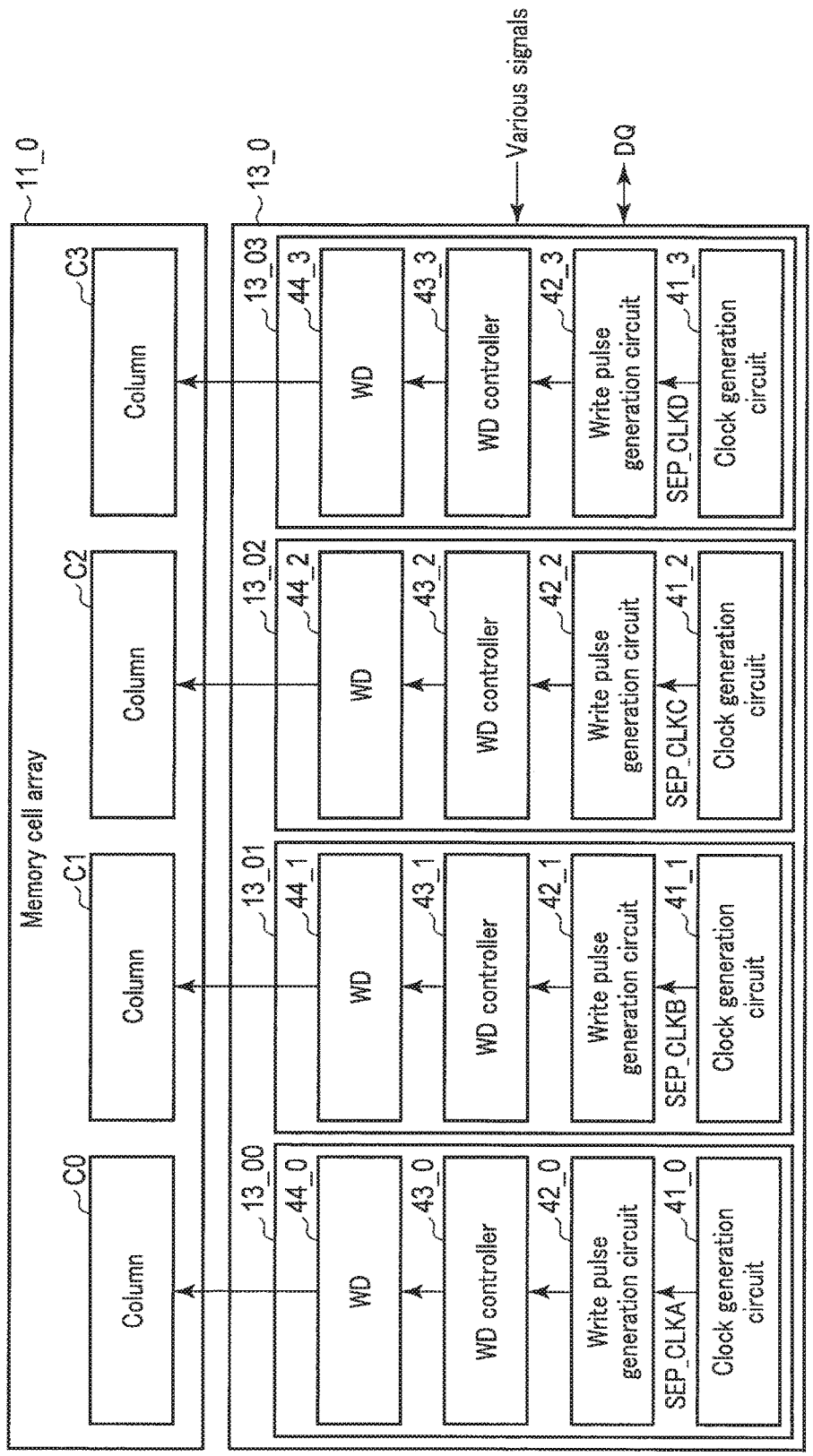
FIG. 16 is a block diagram showing a memory cell array and a read/write circuit of the semiconductor memory device according to a second embodiment.

FIG. 16 is a block diagram showing a memory cell array 11_0 and a read/write circuit 13_0 of the semiconductor memory device according to the second embodiment.

As shown in FIG. 16, in the read/write circuit 13_0, first to fourth write circuits 13_00-13_03 respectively comprise clock generation circuits 41_0-41_3.

The clock generation circuits 41_0-41_3 respectively generate signals SEP_CLKA-SEP_CLK, which are internal clock signals. Thus, in the second embodiment, different internal clocks are generated for the respective columns.

FIG. 17 is a block diagram showing a latch circuit 56 in the semiconductor memory device according to the second embodiment.

As shown in FIG. 17, the latch circuit 56 includes a NOR gate NR21, inverters INV21 and INV22, a NAND gate ND21, and SR latches 56B and 56C.

A signal END_CLK from the counter circuit 57 and a signal RESET are input to the NOR gate NR21. An output of the NOR gate NR21 is input to the inverter INV21.

A signal WENSd is input to a set terminal of the SR latch 56B, and an output of the inverter INV21 is input to a reset terminal of the SR latch 56B. The SR latch 56B outputs a signal PRE_ENABLE from an output terminal Q.

The signal PRE_CLK from the delay circuit 53 and the signal PRE_ENABLE are input to the NAND gate ND21. An output of the NAND gate ND21 is input to the inverter INV22.

An output of the inverter INV22 is input to a set terminal of the SR latch 56C, and an output of the inverter INV21 is input to a reset terminal of the SR latch 56C. The SR latch 56C outputs a signal ENABLE from an output terminal Q/, and outputs a signal ENABLEb from an output terminal Q.

Figure 18:
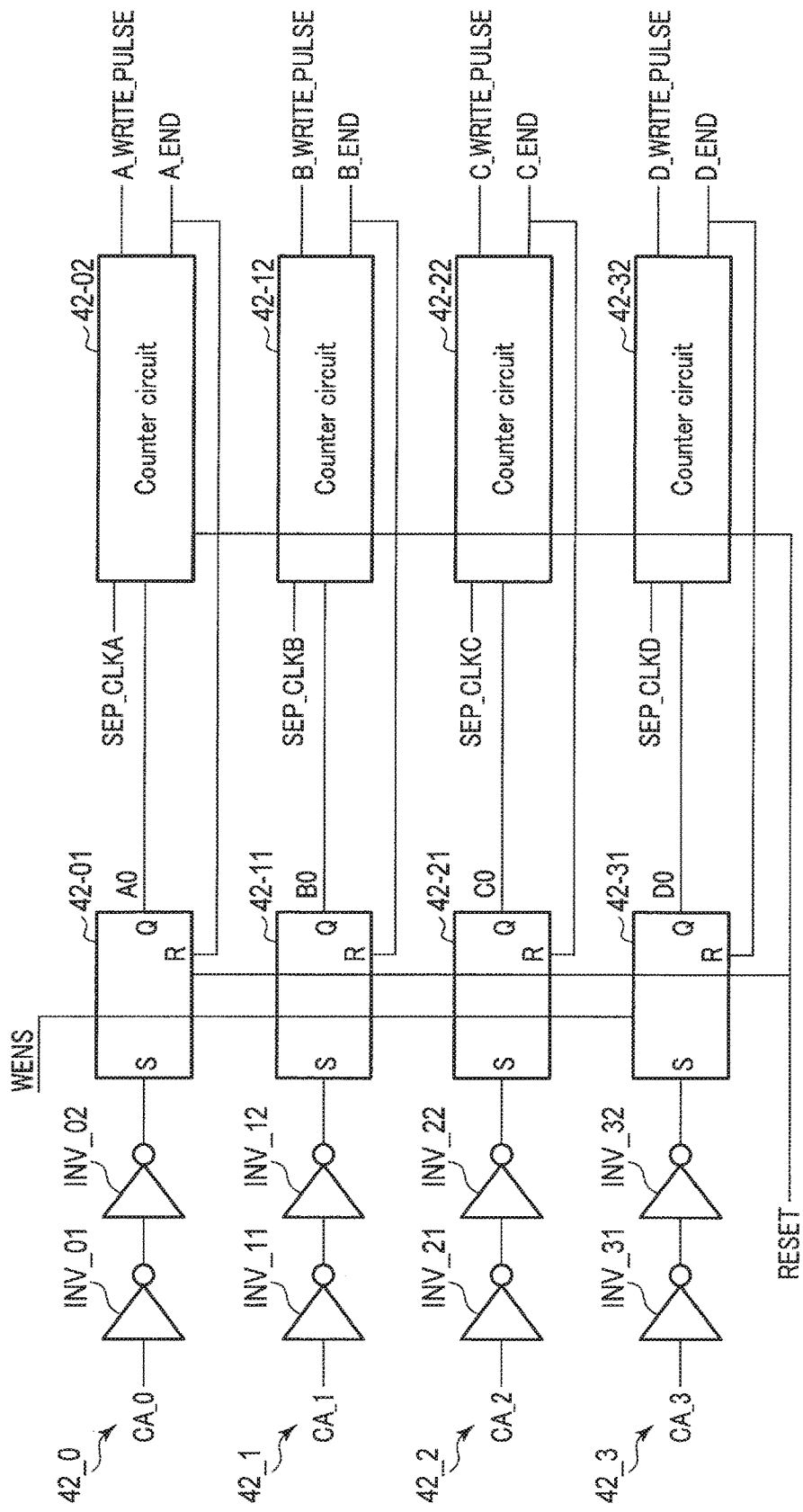
FIG. 18 is a block diagram showing a write pulse generation circuit of the semiconductor memory device according to the second embodiment.

FIG. 18 is a block diagram showing write pulse generation circuits 42_0-42_3 in the semiconductor memory device according to the second embodiment.

As shown in FIG. 18, the signal A0 from the SR latch 42_01 and the signal SEP_CLKA from the clock generation circuit 41_0 are input to the counter circuit 42_02. The signal RESET is also input to the counter circuit 42_02. The counter circuit 42_02 counts the pulse number of the signal SEP_CLKA. The counter circuit 42_02 generates a write pulse (signal A_WRITE_PULSE) corresponding to the pulse number of the SEP_CLKA. The counter circuit 42_02 outputs the signal A_END of the H level, when the pulse number of the signal SEP_CLKA reaches a predetermined number.

Signals B0-D0 are respectively input to the counter circuits 42_12-42_32 and the signals SEP_CLKB-SEP_CLKD are respectively input to the counter circuits 42_12-42_32. The counter circuits 42_12-42_32 respectively output signals B_WRITE_PULSE-D_WRITE_PULSE, and respectively output signals B_END-D_EMD.

[Effect in Second Embodiment]

If a cannon internal clock is supplied to the columns C0-C3, the internal clock may vary depending on the positions of the columns (farther position or nearer position).

In contrast, in the second embodiment, the clock generation circuits 41-_0-41_3 are respectively provided for the columns C0-C3. The signals SEP_CLKA-SEP_CLKD, which are internal clocks, are respectively supplied to the columns C0-C3. Accordingly, variance of the internal clocks due to the positions of the columns C0-C3 can be suppressed.

<Third Embodiment>

In the following, a semiconductor memory device according to the third embodiment will be explained with reference to FIG. 19.

In the first embodiment, the counter circuits 42_02-42_32 for generating a write pulse are respectively provided for the columns C0-C3. In contrast, in the third embodiment, a common counter circuit 45 for generating a write pulse is provided for the columns C0-C3. This embodiment is effective for a case in which writing is performed once during an active period.

With regard to the third embodiment, explanations on the matters which are the same as in the first embodiment are omitted, and mainly the matters which are different are explained.

[Configuration Example in Third Embodiment]

FIG. 19 is a block diagram showing a memory cell array 11_0 and a read/write circuit 13_0 of the semiconductor memory device according to the third embodiment.

As shown in FIG. 19, the read/write circuit 13_0 comprises the counter circuit 45. A clock generation circuit 41 supplies a clock. signal COMMON_CLK, which is an internal clock, to the counter circuit 45. The counter circuit 45 counts the pulse number of the signal COMMON_CLK. The pulse number of the signal COMMON_CLK counted by the counter circuit 45 is input to counter circuits 42_02-42_32 of the respective write pulse generation circuits 42_0-42_3. The counter circuits 42_02-42_32 count the pulses of the signal COMMON_CLK subsequent to the number of counts from the counter circuit 45. Thus, in generation of a write pulse, the halfway count of the pulses of the signal COMMON_CLK is shared by the columns C0-C3.

[Effect in Third Embodiment]

In the third embodiment, the common counter circuit 45 for generating a write pulse is provided for the columns C0-C3. The counter circuit 45 counts the pulse number of the signal COMMON_CLK to halfway of the generation of a write pulse. The counter circuits 42_02-42_32 respectively for the columns C0-C3 count the pulses of the signal COMMON_CLK subsequent to the number of counts from the counter circuit 45. Accordingly, the counter circuits (flip-flops) 42_02-42_32 for the respective columns C0-C3 can he reduced. Therefore, an increase of the circuit area can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell including a variable resistance element; and
a first circuit configured to control writing to the memory cell,
wherein the first circuit is configured to generate a first pulse of a second signal based on a first signal, generate a second pulse of a third signal obtained by delaying the first pulse, and generate a third pulse of a fourth signal obtained by delaying the second pulse,
wherein the first circuit includes:
a counter configured to count a number of third pulses of the fourth signal; and
a multiplexer configured to output either the first signal or the fourth signal as the first signal based on the number of third pulses counted by the counter, and
wherein the first circuit outputs a write pulse based on the fourth signal.

2. The device of claim 1, wherein a change of a pulse width of the first pulse is based on a change of a rising edge timing of the second pulse.

3. The device of claim 1, wherein a write current flows into the memory cell based on the write pulse and a resistance of the memory cell changes based on the write current.

4. The device of claim 1, wherein the first circuit is configured to generate a fourth pulse of the second signal based on the third pulse, generate a fifth pulse of the third signal obtained by delaying the fourth pulse, and generate a sixth pulse of the fourth signal obtained by delaying the fifth pulse.

5. The device of claim 4, wherein:
the first circuit is configured to generate a fifth signal based on a rising edge of the second pulse; and
a falling edge of the first pulse is based on the fifth signal.

6. The device of claim 1, wherein the first circuit is configured to stop generating the second signal based on a sixth signal in accordance with a write command.

7. The device of claim 1, wherein the first circuit is configured to stop generating the second signal when the number of third pulses counted by the counter reaches a first number.

8. The device of claim 7, wherein the first circuit is configured to output a seventh signal based on the fourth signal and stop generating the second signal based on the seventh signal, when the number of third pulses counted by the counter reaches the first number.

9. A semiconductor memory device comprising:
a memory cell including a variable resistance element; and
a first circuit configured to control writing to the memory cell,
wherein the first circuit includes:
a second circuit configured to output a second signal based on a first signal;
a third circuit configured to output a third signal obtained by delaying the second signal;
a fourth circuit configured to output a fourth signal obtained by delaying the third signal;
a fifth circuit configured to count a number of third pulses of the fourth signal; and
a sixth circuit configured to output either the first signal or the fourth signal to the second circuit as the first signal based on the number of third pulses counted by the fifth circuit, and
wherein the first circuit outputs a write pulse based on the fourth signal.

10. The device of claim 9, wherein:
the second circuit is configured to output a first pulse of the second signal based on the first signal;
the third circuit is configured to output a second pulse of the third signal obtained by delaying the first pulse;

the fourth circuit is configured to output a third pulse of the fourth signal obtained by delaying the second pulse; and a falling edge of the first pulse is based on a rising edge of the second pulse.

11. The device of claim 10, wherein a change of a pulse width of the first pulse is based on a change of a rising edge timing of the second pulse.

12. The device of claim 10, wherein:
the first circuit is configured to generate the write pulse based on the number of third pulses counted by the fifth circuit; and
a write current flows into the memory cell based on the write pulse and a resistance of the memory cell changes based on the write current.

13. The device of claim 10, wherein:
the second circuit is configured to output a fourth pulse of the second signal based on the third pulse;
the third circuit is configured to output a fifth pulse of the third signal obtained by delaying the fourth pulse; and
the fourth circuit is configured to output a sixth pulse of the fourth signal obtained by delaying the fifth pulse.

14. The device of claim 10, wherein:
the first circuit includes a seventh circuit configured to output a fifth signal based on the rising edge of the second pulse; and
the falling edge of the first pulse is based on the fifth signal.

15. The device of claim 10, wherein the second circuit is configured to stop generating the second signal based on a sixth signal based on a write command.

16. The device of claim 10, wherein the second circuit is configured to stop generating the second signal when the number of third pulses counted by the fifth circuit reaches a first number.

17. The device of claim 16, wherein:
the fifth circuit is configured to output a seventh signal based on the fourth signal when the number of third pulses counted by the fifth circuit reaches the first number; and
the second circuit is configured to stop generating the second signal based on the seventh signal.

* * * * *